US009818477B2

(12) United States Patent
Shim et al.

(10) Patent No.: US 9,818,477 B2
(45) Date of Patent: Nov. 14, 2017

(54) METHODS OF PROGRAMMING MEMORY CELLS IN NON-VOLATILE MEMORY DEVICES

(71) Applicant: Samsung Electronics Co., Ltd., Suwon-si, Gyeonggi-do (KR)

(72) Inventors: Young-Seop Shim, Seoul (KR); Jae-Hong Kim, Seoul (KR); Jin-Man Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/055,186

(22) Filed: Feb. 26, 2016

(65) Prior Publication Data

US 2016/0372185 A1 Dec. 22, 2016

(30) Foreign Application Priority Data

Jun. 22, 2015 (KR) ........................ 10-2015-0088583

(51) Int. Cl.
*G11C 11/56* (2006.01)
*G11C 16/34* (2006.01)
*G11C 16/04* (2006.01)

(52) U.S. Cl.
CPC ...... *G11C 11/5635* (2013.01); *G11C 11/5628* (2013.01); *G11C 16/0483* (2013.01); *G11C 16/3445* (2013.01); *G11C 16/3459* (2013.01); *G11C 2211/5621* (2013.01)

(58) Field of Classification Search
CPC .................. G11C 11/5635; G11C 16/3459
See application file for complete search history.

(56) References Cited

U.S. PATENT DOCUMENTS

| 5,132,935 | A | * | 7/1992 | Ashmore, Jr. | ......... G11C 16/10 365/185.06 |
| 6,493,265 | B2 | | 12/2002 | Satoh et al. | |
| 6,954,378 | B2 | | 10/2005 | Tanaka | |
| 6,967,873 | B2 | | 11/2005 | Hamilton et al. | |
| 7,301,817 | B2 | * | 11/2007 | Li | ....................... G11C 11/5628 365/185.03 |

(Continued)

FOREIGN PATENT DOCUMENTS

| KR | 1020000044941 A | 7/2000 |
| KR | 1020070013035 A | 1/2007 |

(Continued)

*Primary Examiner* — Hoai V Ho
*Assistant Examiner* — Roberto Mancera
(74) *Attorney, Agent, or Firm* — Ward and Smith, P.A.

(57) ABSTRACT

A method of operating a non-volatile memory device includes receiving program data and a program address. Memory cells that correspond to the program address are selected from among memory cells in an erased state. The selected memory cells are programmed based on the program data such that each of the selected memory cells is programmed to one of a plurality of programmed states, where threshold voltage distributions of the programmed states are different from each other and are higher than a threshold voltage distribution associated with the erased state. By programming all or a portion of the memory cells corresponding to the erased state to have positive threshold voltages, degradation of the data retention capability of the memory cells may be reduced.

15 Claims, 24 Drawing Sheets

(56) References Cited

U.S. PATENT DOCUMENTS

| | | | |
|---|---|---|---|
| 7,539,057 B2* | 5/2009 | Hwang | G11C 11/5628 365/185.03 |
| 7,606,080 B2 | 10/2009 | Lee | |
| 7,852,683 B2* | 12/2010 | Lutze | G11C 11/5635 365/185.17 |
| 7,864,581 B2 | 1/2011 | Lee | |
| 8,064,252 B2 | 11/2011 | Yip | |
| 8,437,186 B2* | 5/2013 | Aritome | G11C 5/04 365/185.03 |
| 8,743,621 B2 | 6/2014 | Park | |
| 9,070,460 B2* | 6/2015 | Yano | G11C 16/10 |
| 9,245,653 B2* | 1/2016 | Hyun | G11C 11/5621 |
| 2005/0276120 A1* | 12/2005 | Hsia | G11C 11/5635 365/185.33 |

FOREIGN PATENT DOCUMENTS

| | | |
|---|---|---|
| KR | 1020070024707 A | 3/2007 |
| KR | 1020130079057 A | 7/2013 |

* cited by examiner

FIG. 10A
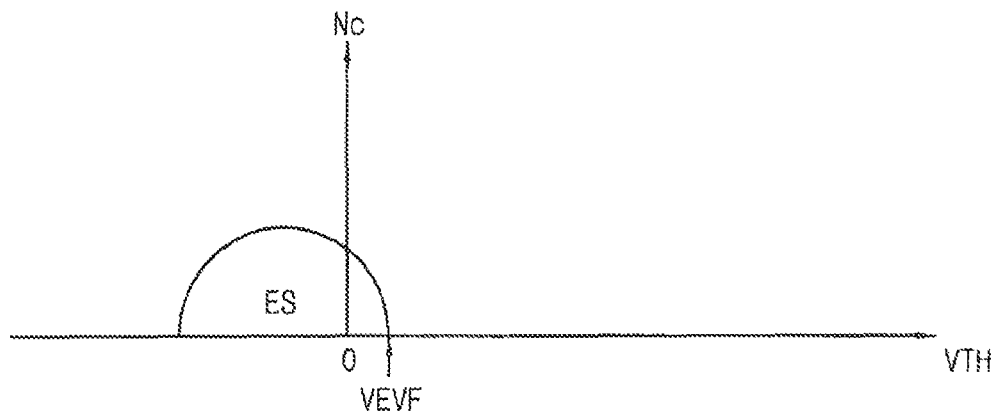
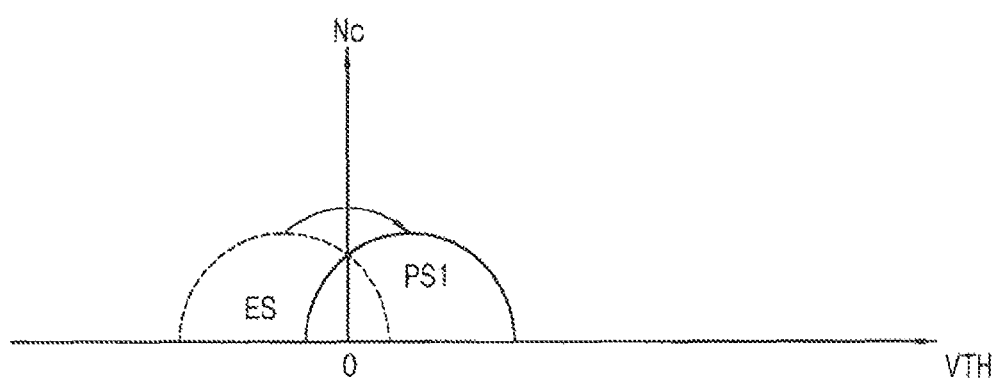
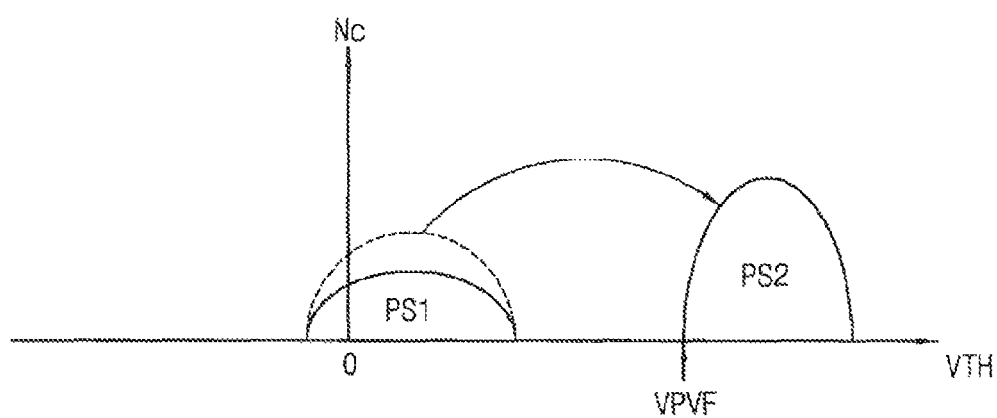

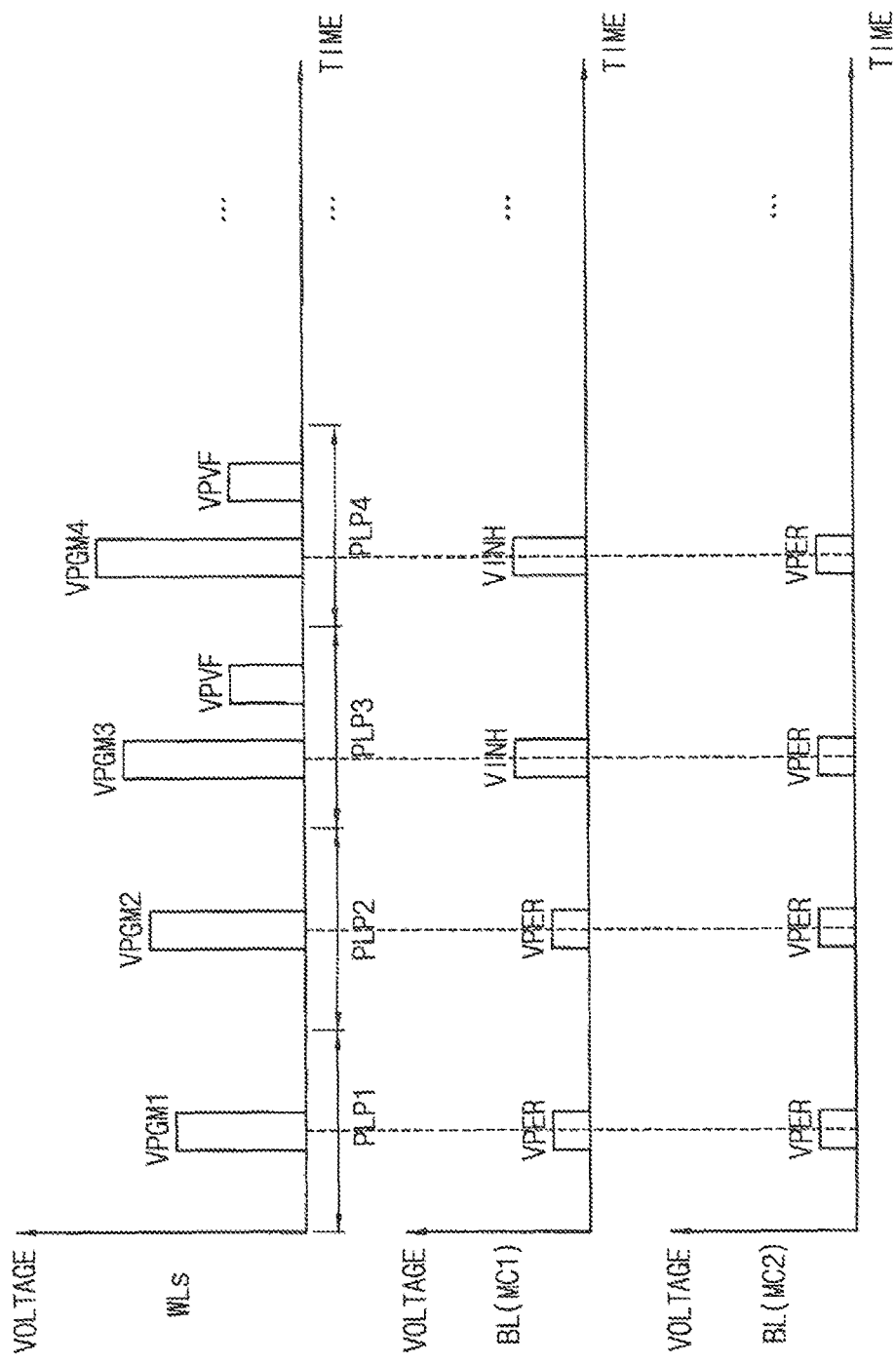

FIG. 12
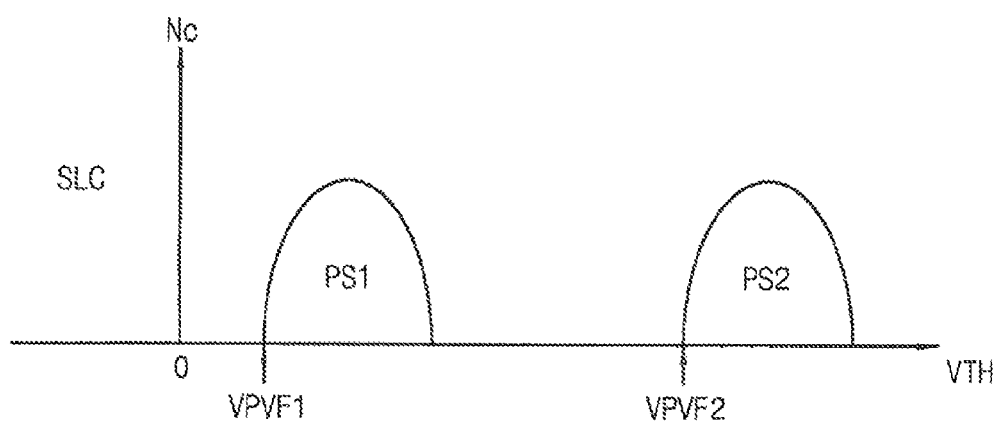
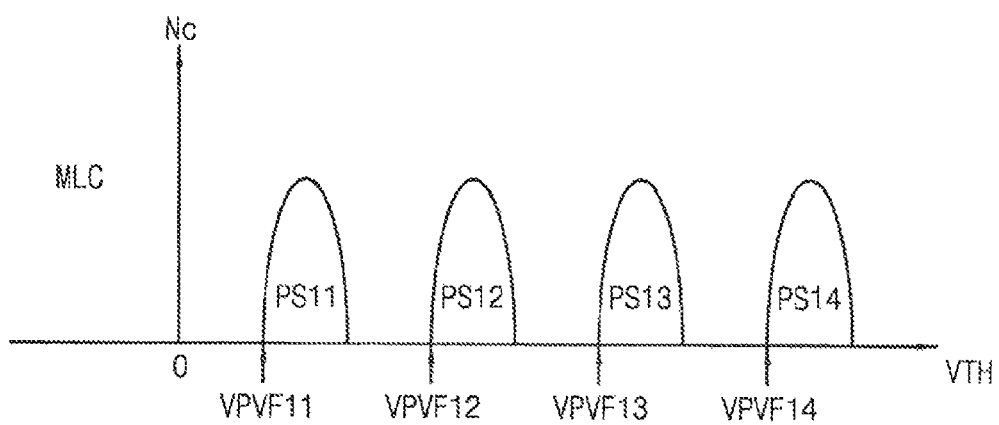

METHODS OF PROGRAMMING MEMORY CELLS IN NON-VOLATILE MEMORY DEVICES

CROSS-REFERENCE TO RELATED APPLICATION

This U.S. non-provisional application claims priority under 35 USC §119 to Korean Patent Application No. 10-2015-0088583, filed on Jun. 22, 2015, in the Korean Intellectual Property Office (KIPO), the disclosure of which is incorporated herein by reference in its entirety.

BACKGROUND

1. Technical Field

Embodiments of the inventive concepts relate generally to semiconductor integrated circuits, and more particularly to non-volatile memory devices and methods of operating non-volatile memory devices.

2. Discussion of the Related Art

Semiconductor memory devices may generally be classified as volatile memory devices or non-volatile memory devices depending on whether the data stored therein is maintained when power is not supplied to the device. Non-volatile memory devices may include electrically erasable and programmable ROM (EEPROM) devices.

EEPROM devices may be operated in a program mode for writing data in memory cells, a read mode for reading out the data stored in the memory cells or an erase mode for initializing the memory cells by deleting the data stored therein. In incremental step pulse programming (ISPP), programming and verification steps may be repeated until the verification is successful.

Non-volatile memory devices may be implemented as single-level cells (SLC) or multi-level cells (MLC). A SLC may store a single data bit, while MLCs may store two or more bits per cell. The distribution of threshold voltages of an SLC may be divided into two states, which may be represented as '1' and '0' in an order of increasing threshold voltage distributions. In this case, '1' corresponds to an erase state having the lowest threshold voltage distribution of the memory cells that are not programmed.

In contrast, a multi-level cell (MLC) may store at least two data bits. When N bits are stored in an MLC, the distribution of the threshold voltages of the MLCs may be divided into $2^N$ states, with each state representing a corresponding value of the N-bit data. For example, when two bits are stored in each MLC, the distribution of the threshold voltages may be divided into four states, which may be represented as '11', '10', '01' and '00' in an order of the increasing threshold voltages. In this case, '11' corresponds to an erase state having the lowest threshold voltage distribution of the memory cells that are not programmed.

The data retention capability of the memory cells in the programmed state may be degraded due to an erase-to-program interval (EPI) effect caused by the memory cells in the erased state.

SUMMARY

Some embodiments of the present inventive concepts may provide methods of operating non-volatile memory devices for improving the data retention capability of the non-volatile memory devices.

Some embodiments of the present inventive concepts may provide a non-volatile memory device having an improved data retention capability.

According to example embodiments, a method of operating a non-volatile memory device includes receiving program data and a program address, selecting selection memory cells from among memory cells in an erased state where the selection memory cells correspond to the program address, and programming all of the selection memory cells based on the program data such that each of the selection memory cells is programmed to one of a plurality of programmed states, where threshold voltage distributions of the programmed states are different from each other and are higher than a threshold voltage distribution of the erased state.

In an example embodiment, at least a portion of the memory cells in the erased state may have positive threshold voltages.

In an example embodiment, all of the selection memory cells may have positive threshold voltages after programming is completed.

In an example embodiment, programming all of the selection memory cells may includes programming first memory cells among the selection memory cells to a first programmed state, the first memory cells corresponding to a first value of the program data where the first programmed state corresponds to the lowest threshold voltage distribution among the programmed states and programming second memory cells among the selection memory cells to a second programmed state, the second memory cells corresponding to a second value of the program data where the second programmed state corresponds to the threshold voltage distribution higher than the lowest threshold voltage distribution.

In an example embodiment, programming the first memory cells may include verifying whether the first memory cells are in the first programmed state using a first program verification voltage, and programming the second memory cells may include verifying whether the second memory cells are in the second programmed state using a second program verification voltage higher than the first program verification voltage.

In an example embodiment, the first program verification voltage may have a positive voltage level such that all of the selection memory cells have the positive threshold voltages after programming is completed.

In an example embodiment, all of the first memory cells and the second memory cells may be programmed to the first programmed state regardless of the program data in at least one initial program loop of incremental step pulse programming (ISPP).

In an example embodiment, a program permission voltage may be applied to all bitlines corresponding to the selection memory cells regardless of the program data in the at least one initial program loop.

In an example embodiment, the method may further include performing an erase operation after receiving a program command to generate an open memory block including the memory cells in the erased state.

In an example embodiment, performing the erase operation may include performing incremental step pulse erasing (ISPE) using an erase verification voltage having a positive voltage level such that at least a portion of the memory cells in the erased state have positive threshold voltages.

In an example embodiment, the method may further include programming single-level cells storing one data bit as multi-level cells storing two or more data bits and programming the multi-level cells as the single-level cells.

In an example embodiment, programming the multi-level cells into the single-level cells may include pre-programming the memory cells programmed as the multi-level cells to a pre-programmed state where a threshold voltage distribution of the pre-programmed state is higher than the threshold voltage distribution of the erased state of the single-level cells and erasing the memory cells in the pre-programmed state to the erased state of the signal-level cells.

In an example embodiment, the non-volatile memory device may be a NAND flash memory device.

In an example embodiment, the non-volatile memory device may be a three-dimensional NAND flash memory device including vertical NAND strings that are extended in a vertical direction.

According to example embodiments, a method of operating a non-volatile memory device includes receiving program data, a program address and a program command, pre-programming memory cells programmed as multi-level cells to a pre-programmed state where a threshold voltage distribution of the pre-programmed state is higher than a threshold voltage distribution of an erased state of single-level cells, erasing the memory cells in the pre-programmed state to the erased state of the signal-level cells, selecting selection memory cells among the memory cells in the erased state where the selection memory cells correspond to the program address and programming all of the selection memory cells based on the program data such that each of the selection memory cells is programmed to one of a first programmed state and a second programmed state where threshold voltage distributions of the first programmed state and the second programmed state are different from each other and higher than the threshold voltage distribution of the erased state.

A method of operating a non-volatile memory device according to further example embodiments includes receiving program data and a program address, selecting a plurality of memory cells that correspond to the program address, wherein the plurality of memory cells are in an erased state, and wherein the plurality of memory cells have a threshold voltage distribution in the erased state such that at least some of the plurality of memory cells have a threshold voltage that is greater than zero, and programming the plurality of memory cells based on the program data such that each of the plurality of memory cells is programmed to one of a plurality of programmed states. The threshold voltage distributions of the plurality of programmed states are different from each other, and the threshold voltage distributions of the plurality of programmed states are higher than the threshold voltage distribution of the erased state.

Programming the plurality of memory cells to the plurality of programmed states may include programming first memory cells of the plurality of memory cells to a first programmed state, the first programming state having a first threshold voltage distribution that is higher than the threshold voltage distribution of the erased state, and programming second memory cells of the plurality of memory cells to a second programmed state, the second programming state having a second threshold voltage distribution that is higher than the first threshold voltage distribution.

In some embodiments, programming the plurality of memory cells to the plurality of programmed states may include programming first and second memory cells of the plurality of memory cells to a first programmed state, the first programming state having a first threshold voltage distribution that is higher than the threshold voltage distribution of the erased state, and programming the second memory cells to a second programmed state, the second programming state having a second threshold voltage distribution that is higher than the first threshold voltage distribution. At least some of the first memory cells in the first programmed state may have threshold voltages less than zero.

The method may further include erasing the plurality of memory cells to the erased state, and verifying whether the plurality of memory cells are in the erased state using an erase verification voltage that is greater than zero.

BRIEF DESCRIPTION OF THE DRAWINGS

Example embodiments of the present disclosure will be more clearly understood from the following detailed description taken in conjunction with the accompanying drawings.

FIG. 10A is a diagram illustrating a method of operating a non-volatile memory device according to still another example embodiment.

FIG. 10B is a diagram illustrating voltages corresponding to the method of FIG. 10A.

FIG. 12 is a diagram for describing a first operation mode and a second operation mode by a method of operating a non-volatile memory device according to an example embodiment.

DETAILED DESCRIPTION OF THE EMBODIMENTS

Figure 1:
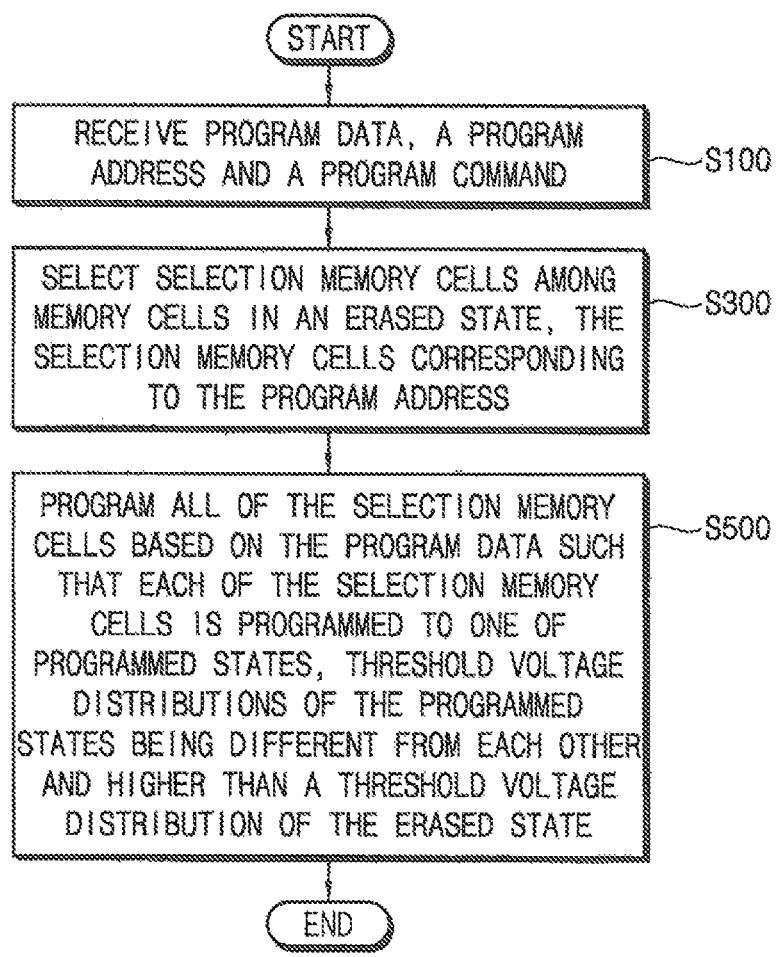
FIG. 1 is a flow chart illustrating a method of operating a non-volatile memory device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The non-volatile memory device according to example embodiments may include NAND flash memory, vertical NAND flash memory, NOR flash memory, resistive random access memory (RRAM), phase-change random access memory (PRAM), magneto-resistive random access memory (MRAM), ferroelectric random access memory (FRAM), spin transfer torque random access memory (STT-RAM), etc. In some example embodiments, the non-volatile memory device may have a three-dimensional array structure. At least some example embodiments may be applied to charge trap flash (CTF) memory in which the charge storage is implemented with a dielectric film, in addition to typical flash memory in which the charge storage is implemented with a conductive floating gate. In this disclosure, example embodiments are described based on the NAND flash memory for convenience of description.

FIG. 1 is a flow chart illustrating a method of operating a non-volatile memory device according to example embodiments.

Referring to FIG. 1, program data, a program address and a program command are received by the non-volatile memory device (S100). Selection memory cells are selected from among memory cells in an erased state, where the selection memory cells correspond to the program address (S300). The program address may include a column address for selecting a bitline and a row address for selecting a wordline. The program operation may be performed on memory cells connected to a wordline that is selected based on the row address. Hereinafter, the memory cells connected to the selected wordline may be referred to as the "selection memory" or "selection memory cells."

For example, a flash memory device may receive a program command and program address and may responsively select a wordline for performing the program operation or the write operation based on the row address. The write operation may be performed such that predetermined voltages are applied to the wordlines and the bitlines to change the threshold voltages of the selection memory cells. A program voltage may be applied to the selected wordline, while a pass voltage may be applied to the unselected wordlines. The target memory cells may be programmed by applying a program permission voltage or a program inhibition voltage to the respective bitlines based on the program data.

The selection memory cells to be programmed may be in an erased state. A NAND flash memory may perform an erase operation by units of memory blocks. In addition, a NAND flash memory device may perform a program operation by units of pages. That is, in general, NAND flash memory may be programmed one memory page at a time and erased one memory block at a time, where a "page" refers to all memory cells coupled to a particular word line, and a "block" refers to a group of pages connected between a particular common source line and string selection line.

A memory block may be described as an open memory block or a closed memory block depending on its state. An open memory block includes programmable memory cells in an erased state. A closed memory block includes memory cells that are not in an erased state. A program operation cannot be performed on a closed memory block. If there is no open memory block, or if another open memory block is needed, an erase operation has to be performed. In some example embodiments, an erase operation may be performed after receiving a program command so as to generate an open memory block including memory cells in the erased state.

All of the selection memory cells are programmed based on the program data, such that each of the selection memory cells is programmed to one of a plurality of programmed states, where threshold voltage distributions of the programmed states are different from each other and are higher than a threshold voltage distribution of the erased state (S500).

In case of single-level cells, as will be described below with reference to FIGS. 6 through 11B, the selection memory cells in the erased state to be programmed may be divided into first memory cells MC1 corresponding to a first value of the program data (e.g., a bit value of '1') and second memory cells MC2 corresponding to a second value of the program data (e.g., a bit value of '0'). The first memory cells MC1 may be programmed to a first programmed state PS1 corresponding to the lowest threshold voltage distribution among the programmed states. The second memory cells MC2 may be programmed to a second programmed state PS2 corresponding to a threshold voltage distribution that is higher than the lowest threshold voltage distribution of the first programmed state PS1.

In some example embodiments, as will be described below with reference to FIGS. 6 through 9, 11A and 11B, all of the selection memory cells may have positive threshold voltages after programming is completed. In other example embodiments, as will be described below with reference to FIGS. 10A and 10B, at least a portion of the selection memory cells may have positive threshold voltages after programming is completed.

As such, the methods of operating non-volatile memory devices described herein may reduce degradation of the data retention capability due to the EPI effect by programming all or a portion of the memory cells corresponding to the erased state to have positive threshold voltages.

Figure 2:
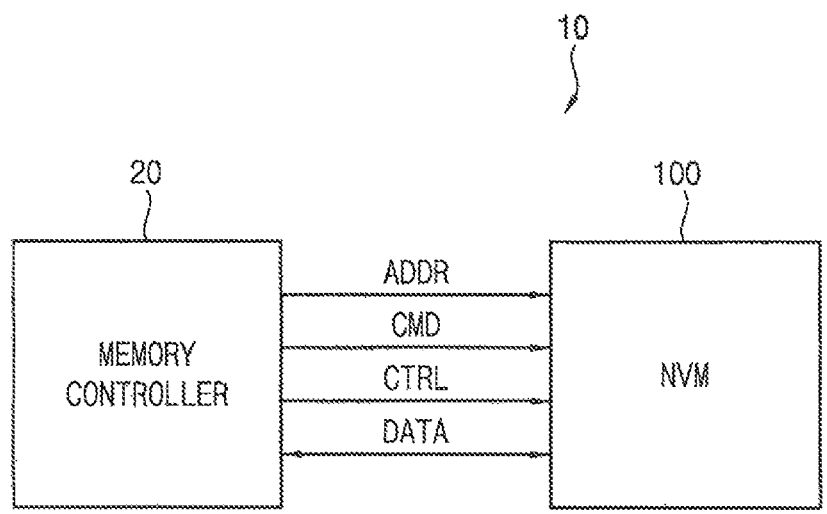
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and a non-volatile memory device 100. The memory controller 20 may control the non-volatile memory device 100 in response to signals received from an external device such as a host, an application processor, etc. For example, the memory controller 20 may transfer data DATA, an address ADDR, a command CMD and a control signal CTRL to the non-volatile memory device 100 in response to the request from the external device.

The non-volatile memory device 100 may perform the read operation, the write (program) operation, the erase operation, etc. according to the control of the memory controller 20.

As will be described below with reference to FIGS. 12 through 17, the memory system 10 according to example embodiments may change the operation mode. In some example embodiments, the memory system 10 may change the operation mode responsive to the control of the external device. In other example embodiments, the memory system 10 may change the operation mode based on a number of program and erase (P/E) cycles experienced by the memory system 10. The operation mode may affect the number of bits stored in each memory cell. For example, the operation mode may include a first operation mode in which the memory cells are operated as single-level cells that stores a single data bit and a second operation mode in which the memory cells are operated as multi-level cells that store two or more data bits.

Figure 3:
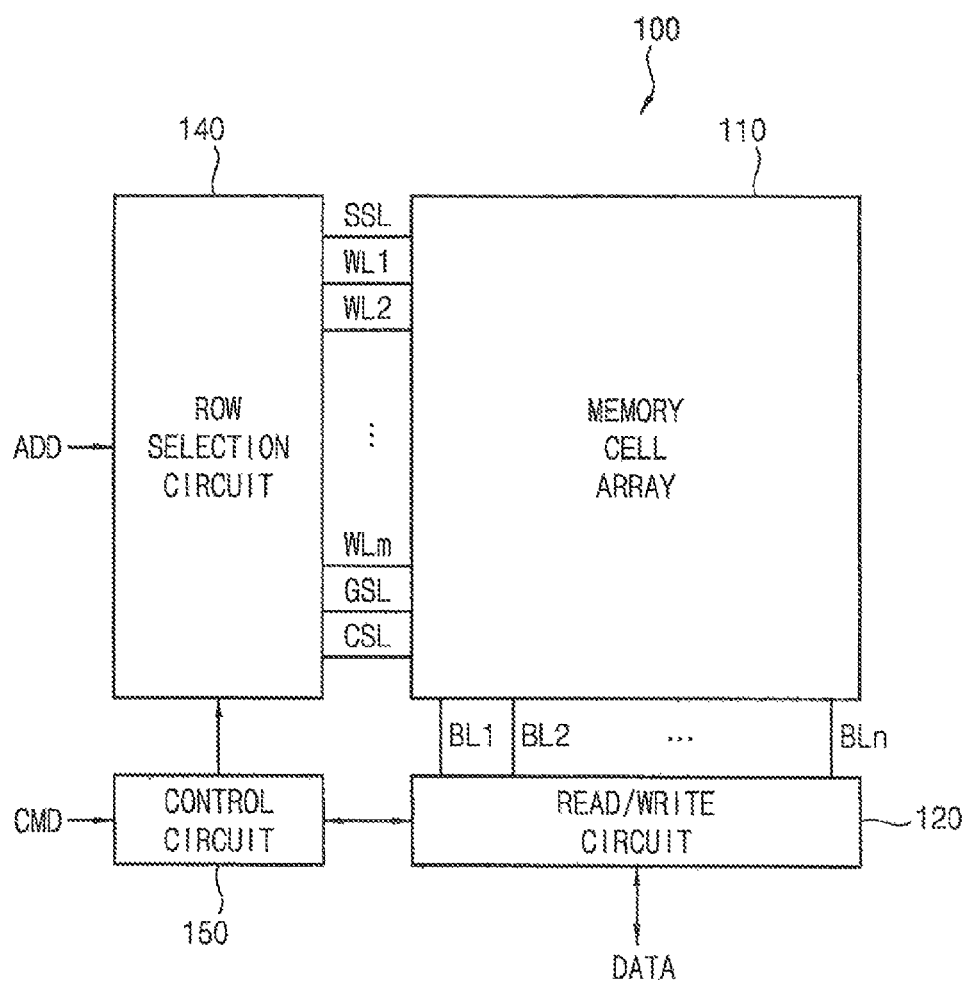
FIG. 3 is a block diagram illustrating a non-volatile memory device according to example embodiments.
Figure 4:
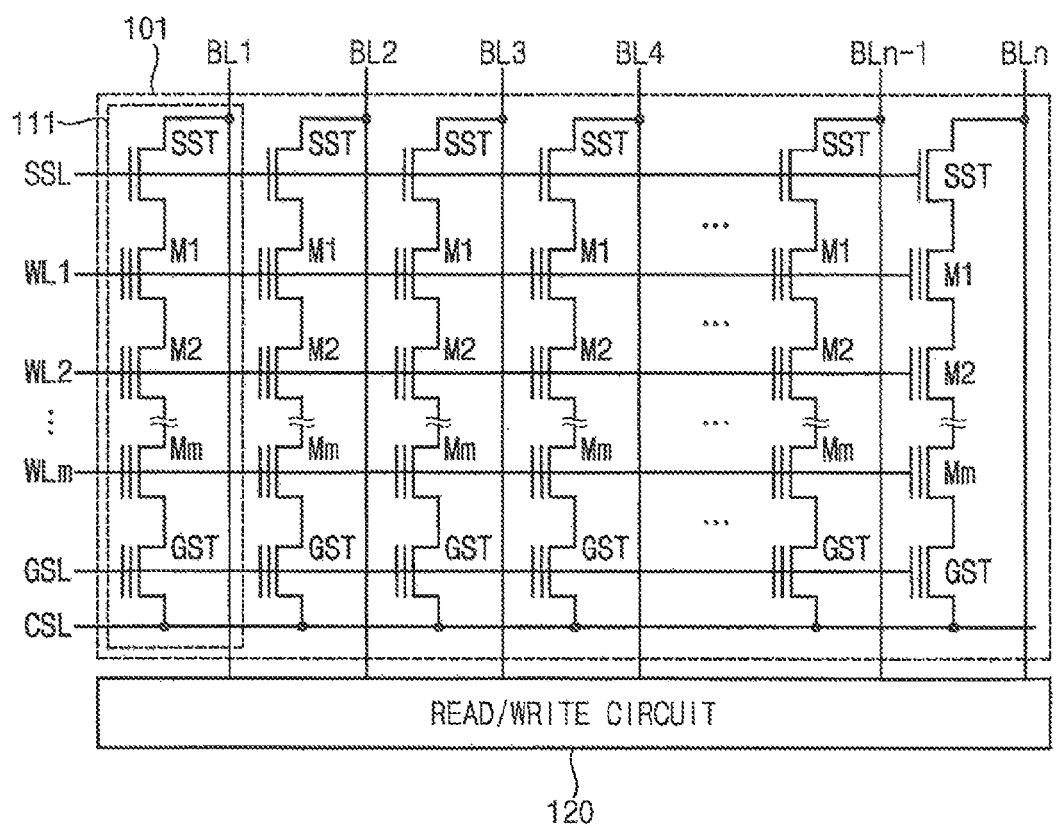
FIG. 4 is a diagram illustrating an example of a memory cell array in the non-volatile memory device of FIG. 3.

FIG. 3 is a block diagram illustrating a non-volatile memory device according to example embodiments, and FIG. 4 is a diagram illustrating an example of a memory cell array in the non-volatile memory device of FIG. 3. For convenience of description, a NAND flash memory device is illustrated in FIGS. 3 and 4 as an example of the non-volatile memory device.

Referring to FIGS. 3 and 4, a flash memory device 100 may include a memory cell array 110, a read/write circuit 120, a row selection circuit 140 and a control circuit 150. The memory cell array 110 may include a plurality of memory cells. Each memory cell may store one-bit data or multi-bit data.

The memory cell storing one bit may be referred to as a single-level cell (SLC) and the memory cell storing multiple bits may be referred to as a multi-level cell (MLC). The memory cell array 110 may include a main region for storing general data and a spare region for storing additional information including, for example, flag information, error correction code, device code, maker code, page information etc. In some embodiments, the main region may include the MLCs and the spare region may include SLCs or MLCs.

The memory cell array 110 may include a plurality of memory cells that are disposed at cross points of a plurality of rows or word line and a plurality of columns or bit lines. The memory cells in the memory cell array 110 may form a plurality of memory blocks. As illustrated in FIG. 4, the memory cells in each memory block 101 of the memory cell array 110 may have the NAND string structure.

Referring to FIG. 4, one memory block 101 may include a plurality of NAND strings corresponding to a plurality of columns or bit lines BL1~BLn. Each string 111 may include a string selection transistor SST, a plurality of memory cells M1~Mm and a ground selection transistor GST. In each string 111, the drain of the string selection transistor SST is coupled to the corresponding one of the bit lines BL1~BLn and the source of the ground selection transistor GST is coupled to the common source line CSL. The memory cells M1~Mm are coupled serially between the source of the string selection transistor SST and the drain of the ground selection transistor GST.

The control gates of the memory cells in the same row may be commonly coupled to the corresponding one of the word lines WL1~WLm. The string selection transistor SST is controlled by the voltage on the string selection line SSL, and the ground selection transistor GST is controlled by the voltage on the ground selection line GSL. The memory cells M1~Mm are controlled by the voltages on the word lines WL1~WLm. The memory cells coupled to each word line may store one page of data. In other embodiments, the memory cells coupled to each word line may store multiple pages of data or a sub-page of data that is smaller than one page.

The unit used for programming may be determined in various ways. For example, write read operations of the NAND flash memory device may be performed in units of pages, while erase operations may be performed in units of memory blocks, which include multiple pages. In the case of MLCs, the program operation may be performed independently for the respective bits. Each memory block may be operated in one of a first operation mode in which the memory cells are programmed and read as SLCs and a second operation mode in which the memory cells are programmed and read as MLCs.

Referring again to FIG. 3, the control circuit 150 may control the overall operations associated with the write, read and erase operations of the flash memory device 100. The data to be programmed may be loaded to the read/write circuit 120 under control of the control circuit 150. During the program operation, the control circuit 150 may control the row selection circuit 140 and the read/write circuit 120 so that the program voltage Vpgm is applied to the selected word line, the program pass voltage Vpass is applied to the unselected word lines, and the bulk bias voltage (e.g., 0V) is applied to the bulk of the memory cells.

The program voltage Vpgm may be generated according to incremental step pulse programming (ISPP). The level of the program voltage Vpgm may be increased or decreased sequentially by a voltage interval ΔV as the program loops are repeated. The number of the program pulses, the voltage levels of the program pulses, the duration time of each program pulse, etc. may be determined by the control circuit 150 or by an external memory controller.

The control circuit 150 may generate the bulk voltage and the word line voltages, such as the program voltage Vpgm, the pass voltage Vpass, the program verification voltage Vpvf, the read voltage Vread, etc. The row selection circuit 140 may select one memory block in the memory cell array 110 and one word line in the selected memory block, in response to the row address and the control signals from the control circuit 150. The row selection circuit 140 may provide the corresponding word line voltages to the selected word line and the unselected word lines in response to the control signals from the control circuit 150.

The read/write circuit 120 is controlled by the control circuit 150 to operate as a sense amplifier or a write driver depending on the operation mode. For example, the read/write circuit 120 may operate as a sense amplifier for reading out the data from the memory cell array 110 during a verification read operation or a normal read operation. The data output during a normal read operation may be provided to an external device, such as a memory controller or a host device, while the data output during a verification read operation may be provided to a pass/fail verification circuit (not shown).

In case of a write operation, the read/write circuit 120 may operate as the write driver for driving the bit lines based on the data to be written in the memory cell array 110. The read/write circuit 120 may receive the data from the external device and drive the bit lines based on the received data. The read/write circuit 120 may include a plurality of page buffers corresponding to a plurality of rows of bit lines.

In programming the memory cells coupled to the selected word line, the program voltage Vpgm and the program verification voltage Vpvf may be applied alternatively to the selected word line. For the verification operation, the bit lines coupled to the selected memory cells may be precharged. The voltage change of the precharged bit line may be detected by the corresponding page buffer. The detected data during the verification read operation may be provided to the pass/fail verification circuit to determine whether the corresponding memory cell has been programmed successfully.

Figure 5:
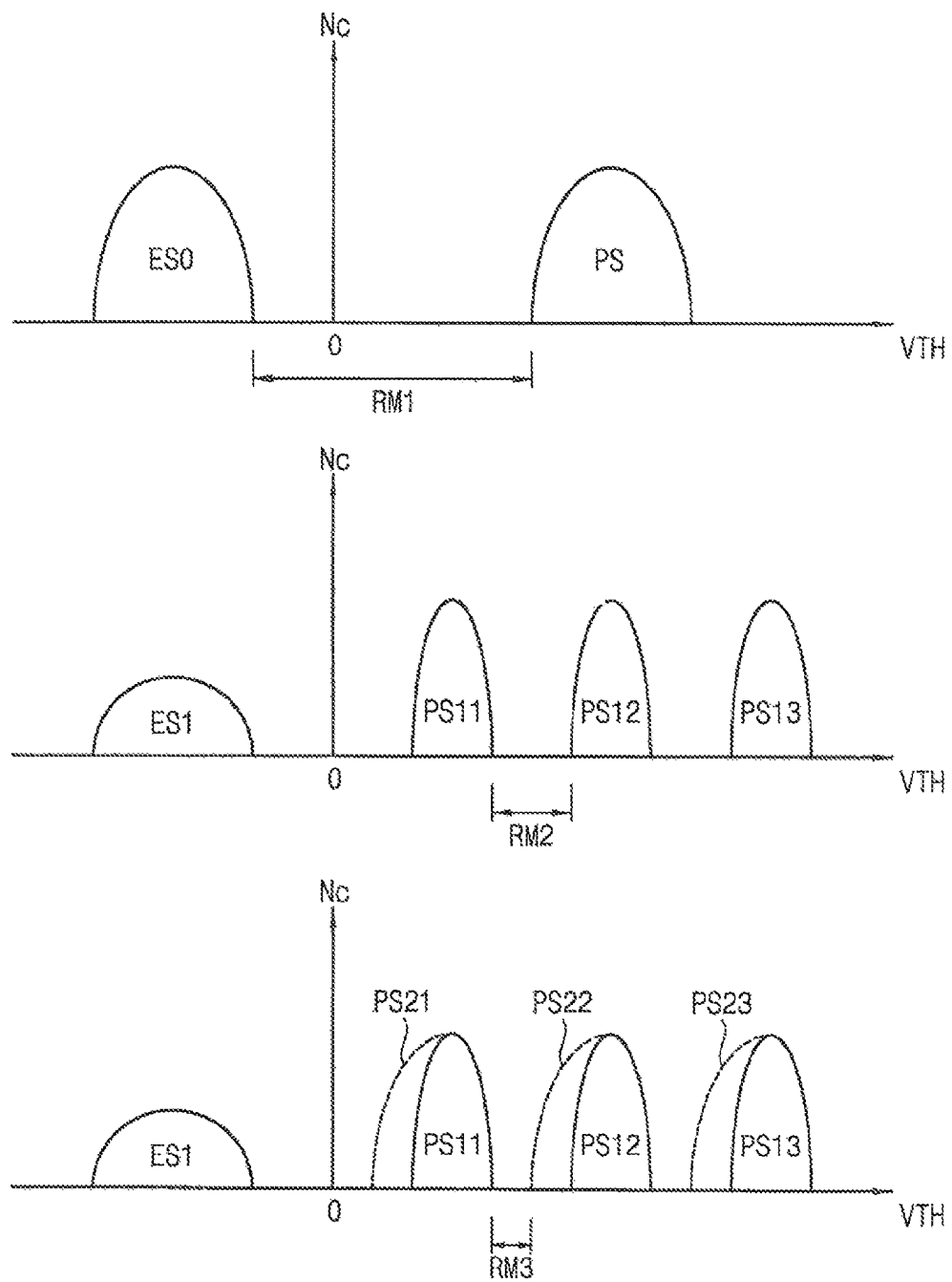
FIG. 5 is a diagram for describing an erase-to-program interval (EPI) effect in flash memory cells.

FIG. 5 is a diagram that illustrates an erase-to-program interval (EPI) effect in flash memory cells. In FIG. 5, the horizontal axis represents the threshold voltage of the memory cells and the vertical axis represents the number Nc of the memory cells having the corresponding threshold voltage.

The memory cells may be programmed as SLCs in a first operation mode, or the memory cells may be programmed as MLCs in a second operation mode. Even though it is assumed for convenience of description that each memory cell stores two data bits in the second operation mode, each memory cell may store three or more data bits in the second operation mode.

As illustrated in FIG. 5, in the first operation mode, a memory cell may be in one of an erased state ES0 or a programmed state PS. In a second operation mode, the memory cell may be in one of an erased state ES1 or a programmed state PS11, PS12 or PS13.

Read margin (RM) refers to the difference in threshold voltage between a programmed state and an erased state, or between two program states. For example, referring to FIG. 5, in an SLC, the read margin RM1 is the difference in threshold voltage between the highest threshold voltage of the cells in the erased state ES0 and the lowest threshold voltage of the cells in the programmed states PS. Likewise, in an MLC the read margin RM2 is the difference in threshold voltage between the highest threshold voltage of the cells in one state and the lowest threshold voltage of the cells in the next higher state.

In general, the read margin RM1 of the first operation mode may be greater than the read margin RM2 of the second operation mode; thus, the data accuracy of the SLCs is typically better than that of the MLCs. Accordingly, important data, such as metadata, may be stored in SLCs according to the first operation mode and other normal data may be stored in MLCs according to the second operation mode.

The erased states ES0 and ES1 of the memory cells correspond to excessively-erased states of cells having negative threshold voltages. In such excessively-erased states, holes accumulate in storage layers of the memory cells, and the accumulated holes may diffuse around over time. The diffused holes may combine with the electrons stored in the programmed memory cells, which can distort the threshold voltage distribution of the neighboring memory cells. This effect may be referred to as the erase-to-program interval (EPI) effect.

The read margin RM2 of the second operation mode is narrower than the read margin RM1 of the first operation mode. Therefore the EPI effect may become more pronounced if SLCs are programmed as and converted to MLCs. As shown in the bottom graph of FIG. 5, the threshold voltage distributions of the programmed states PS11, PS12 and PS13 may become distorted by the EPI effect, resulting in an even more reduced read margin RM3.

Methods of programming SLCs according to various embodiments of the inventive concepts are described herein with reference to FIGS. 6 through 11B. In case of SLCs, the selection memory cells corresponding to the program address may be divided into first memory cells MC1 corresponding to a first value of the program data (e.g., a bit value of '1') and second memory cells MC2 corresponding to a second value of the program data (e.g., a bit value of '0').

Figure 6:
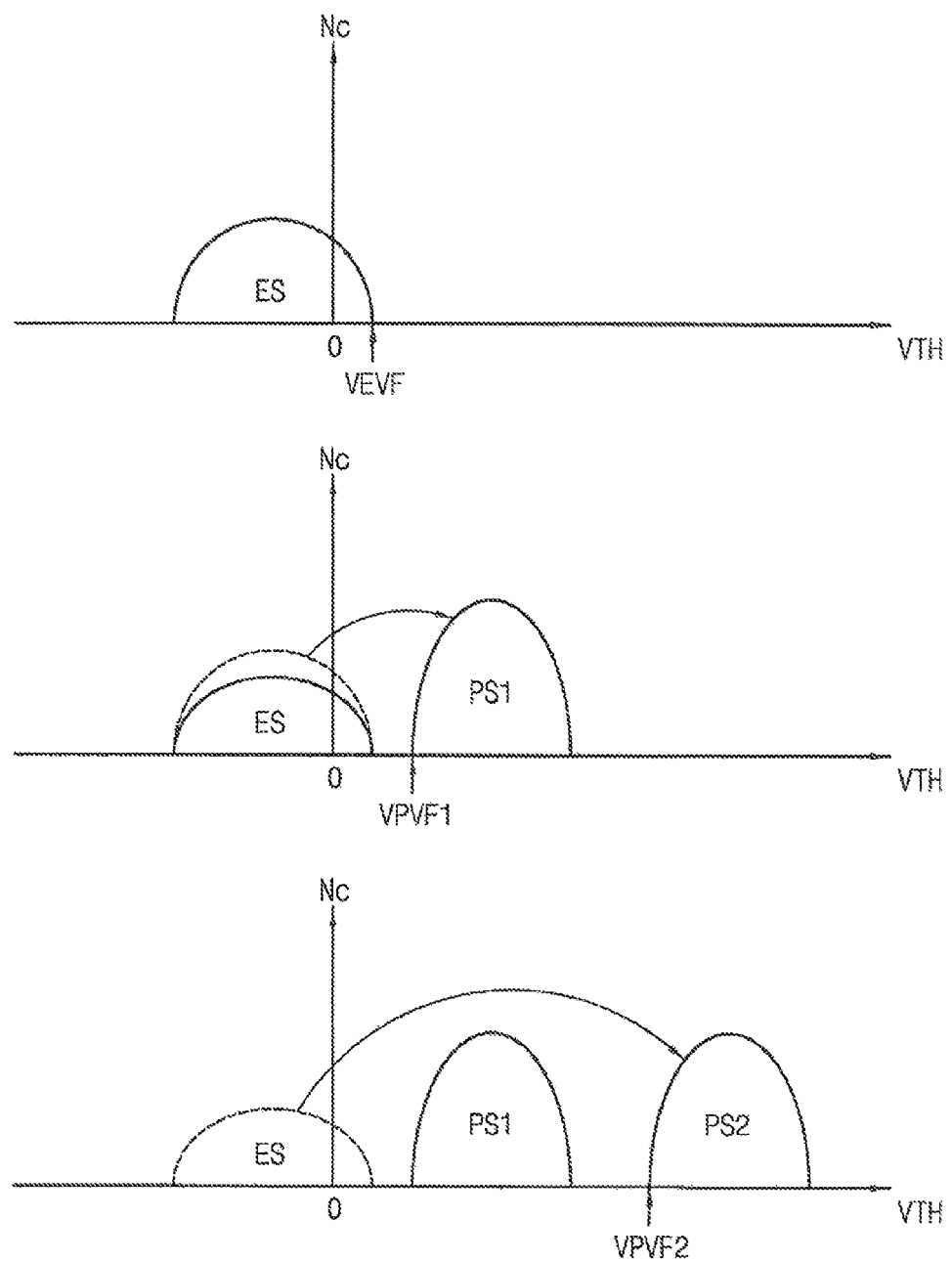
FIG. 6 is a diagram illustrating a method of operating a non-volatile memory device according to an example embodiment.
Figure 7:
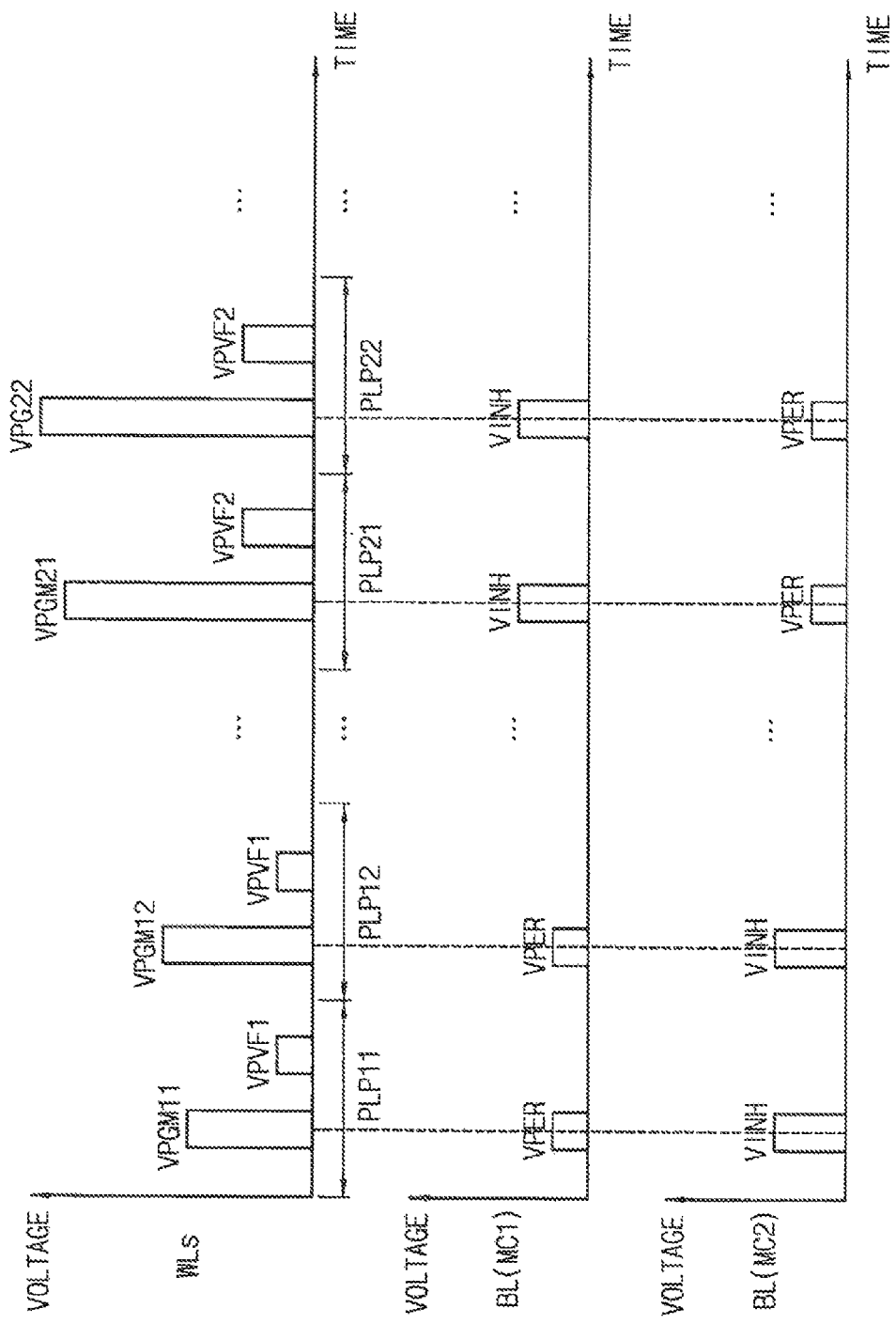
FIG. 7 is a diagram illustrating voltages corresponding to the method of FIG. 6.

FIG. 6 is a diagram illustrating a method of operating a non-volatile memory device according to some embodiments, and FIG. 7 is a diagram illustrating voltages corresponding to the method of FIG. 6. In FIG. 6, the horizontal axis represents the threshold voltage of the memory cells and the vertical axis represents the number Nc of the memory cells having the corresponding threshold voltage. In FIG. 7, the horizontal axis represents an elapsed time and the vertical axis represents voltage level.

Referring to FIG. 6, all of the selection memory cells may be programmed from the erased state ES to one of a first programmed state PS1 or a second programmed state PS2, respectively. The threshold voltage distribution of the first programmed state PS1 is higher than the threshold voltage distribution of the erased state ES, and the threshold voltage distribution of the second programmed state PS2 is higher than the threshold voltage distribution of the first programmed state PS1. The first memory cells MC1 may be programmed to the first programmed state PS1, while the second memory cells MC2 may be programmed to the second programmed state PS2.

After the first memory cells MC1 have been programmed, a verification step may be performed in which it is determined whether the first memory cells MC1 are in the first programmed state PS1 by applying a first program verification voltage VPVF1 to the first memory cells MC1. In the same way, the programming of the second memory cells MC2 may be verified by determining whether the second memory cells MC2 are in the second programmed state PS2 using a second program verification voltage VPVF2 that is higher than the first program verification voltage VPVF1.

Referring to FIGS. 6 and 7, the first memory cells MC1 may be programmed to the first programmed state PS1, and the programming of the first memory cells MC1 is verified. Then, the second memory cells MC2 may be programmed to the second programmed state PS2, and the programming of the second memory cells MC2 is verified.

In a first program loop PLP1, a first program voltage VPGM11 is applied to selected wordline WLs, a program permission voltage VPER is applied to the bitlines BL(MC1) of the first memory cells MC1 and a program inhibition voltage VINH is applied to the bitlines BL(MC2) of the second memory cells MC2. Accordingly, in the first program loop PLP11, the first memory cells MC1 may be programmed while the second memory cells MC2 are not programmed.

After applying the first program voltage VPGM11, a first program verification voltage VPVF1 is applied to the selected wordline WLs to verify whether the threshold voltages of all of the first memory cells MC1 have reached a target voltage level. If the first memory cells MC1 are not fully programmed, a second program loop PLP12 may be performed.

The second program loop PLP12 is similar to the first program loop PLP11, but a second program voltage VPGM12 that is higher than the first program voltage VPGM11 is applied to the selected wordline WLs in the second program loop PLP12. In this manner, incremental step pulse programming (ISPP) may be performed by increasing the program voltage after each programming loop until the programming of the first memory cells MC1 is completed.

After the programming of the first memory cells MC1 is completed, the second memory cells MC2 may be programmed. In a third program loop PLP21, a third program voltage VPGM21 is applied to the selected wordline WLs, the program permission voltage VPER is applied to the bitlines BL(MC2) of the second memory cells MC1 and the program inhibition voltage VINH is applied to the bitlines BL(MC1) of the first memory cells MC1. Accordingly, the second memory cells MC2 may be programmed, while the first memory cells MC1 are not disturbed.

After applying the third program voltage VPGM21, a second program verification voltage VPVF2 that is higher than the first program verification voltage VPVF1 is applied to the selected wordline WLs to verify whether the threshold voltages of all of the second memory cells MC2 have reached a target voltage level. If the second memory cells MC2 are not fully programmed, a fourth program loop PLP22 may be performed.

The fourth program loop PLP22 is similar to the third program loop PLP21, but a fourth program voltage VPGM22 higher than the third program voltage VPGM21 is applied to the selected wordline WLs in the fourth program loop PLP22. As with the first memory cells MC1, ISPP may be performed by incrementally increasing the program voltage after each programming loop until the programming of the second memory cells MC2 is completed.

As illustrated in FIG. 6, the first program verification voltage VPVF1 may have a positive voltage level, so that all of the first memory cells MC1 have the positive threshold voltages after programming is completed. As such, degradation of the data retention capability due to the EPI effect may be reduced by programming all of the first memory cells MC1 from the erased state ES to the first programmed state PS1 having positive threshold voltages.

At least a portion of the selection memory cells in the erased state ES may have positive threshold voltages, as illustrated in FIG. 6. As discussed above, a memory block may be described as an open memory block or a closed memory block depending on its state, where an open memory block includes programmable memory cells in the erased state, and a closed memory block includes memory cells that are not in the erased state. Moreover, a program operation cannot be performed on a closed memory block.

If there is no open memory block, or another open memory block is needed, an erase operation may be performed on a closed memory block. In some example embodiments, an erase operation may be performed after receiving a program command in order to generate an open memory block including memory cells in the erased state. The erase operation may be performed by incremental step pulse erasing (ISPE) using an erase verification voltage VEVF having a positive voltage level, so that at least a portion of the memory cells in the erased state have positive threshold voltages. By increasing the threshold voltage distribution of the erased state, the EPI effect may be further reduced to enhance performance of the non-volatile memory device.

Figure 8:
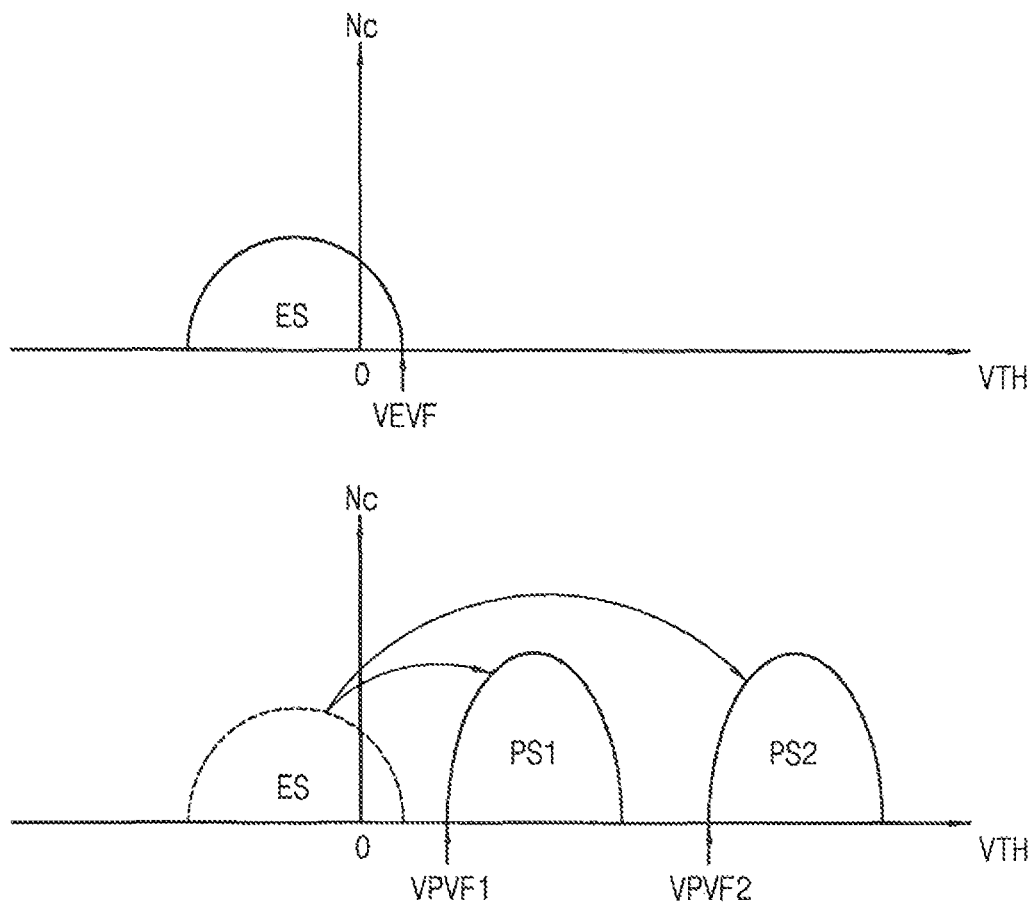
FIG. 8 is a diagram illustrating a method of operating a non-volatile memory device according to another example embodiment.
Figure 9:
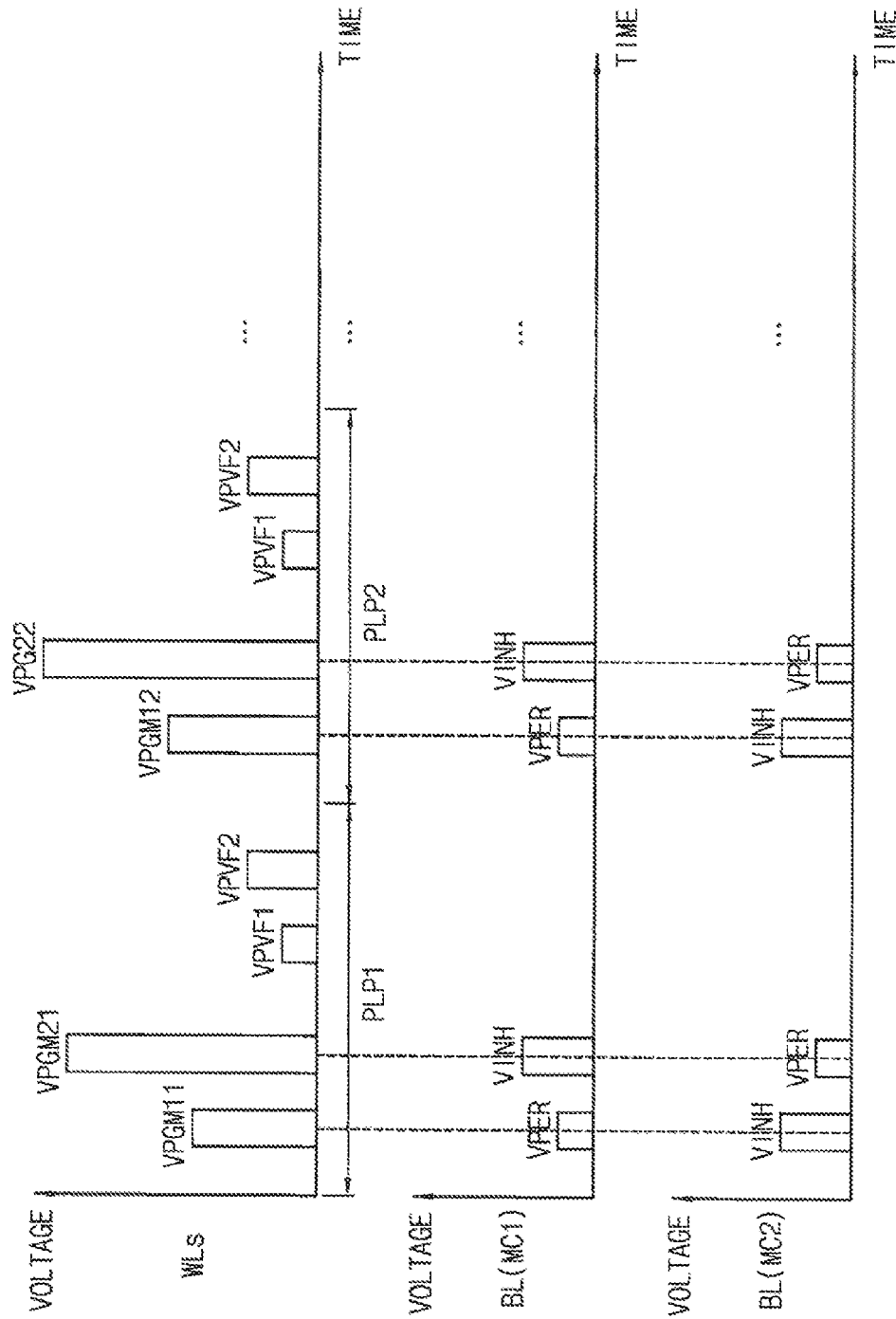
FIG. 9 is a diagram illustrating voltages corresponding to the method of FIG. 8.

FIG. 8 is a diagram illustrating a method of operating a non-volatile memory device according to another example embodiment, and FIG. 9 is a diagram illustrating voltages corresponding to the method of FIG. 8. In FIG. 8, the horizontal axis represents the threshold voltage of the memory cells and the vertical axis represents the number Nc of the memory cells having the corresponding threshold voltage. In FIG. 9, the horizontal axis represents an elapsed time and the vertical axis represents the voltage level.

All of the selection memory cells may be programmed from the erased state ES to one of the first programmed state PS1 or the second programmed state PS2, respectively. The threshold voltage distribution of the first programmed state PS1 is higher than the threshold voltage distribution of the erased state ES, and the threshold voltage distribution of the second programmed state PS2 is higher than the threshold voltage distribution of the first programmed state PS1. The first memory cells MC1 may be programmed to the first programmed state PS1 corresponding to a lowest threshold voltage distribution among the programmed states PS1 and PS2. The second memory cells MC2 may by programmed to the second programmed state PS2 corresponding to a threshold voltage distribution higher than the lowest threshold voltage of the first programmed state PS1.

The programming of the first memory cells MC1 may be performed with verification of whether the first memory cells MC1 are in the first programmed state PS1 using a first program verification voltage VPVF1. In the same way, the second memory cells MC2 may be programmed with verification of whether the second memory cells MC2 are in the second programmed state PS2 using a second program verification voltage VPVF2 that is higher than the first program verification voltage VPVF1.

Referring to FIGS. 8 and 9, the first memory cells MC1 may be programmed to the first programmed state PS1 and the second memory cells MC2 may be programmed to the second programmed state PS2 before the programming of the first memory cells MC1 or the second memory cells MC2 is verified.

In a first program loop PLP1, a first program voltage VPGM11 is applied to a selected wordline WLs, a program permission voltage VPER is applied to the bitlines BL(MC1) of the first memory cells MC1 and a program inhibition voltage VINH is applied to the bitlines BL(MC2) of the second memory cells MC2. Accordingly, among the selection memory cells, the first memory cells MC1 may be programmed. After that, a second program voltage VPGM21 is applied to the selected wordline WLs, the program permission voltage VPER is applied to the bitlines BL(MC2) of the second memory cells MC2 and the program inhibition voltage VINH is applied to the bitlines BL(MC1) of the first memory cells MC1. Accordingly, among the selection memory cells, the second memory cells MC2 may be programmed.

After applying the first program voltage VPGM11 and the second program voltage VPGM21, a first program verification voltage VPVF1 is applied to the selected wordline WLs to verify whether the threshold voltages of all of the first memory cells MC1 have reached a first target voltage level. After that, a second program verification voltage VPVF2 that is higher than the first program verification voltage VPVF1 is applied to the selected wordline WLs to verify whether the threshold voltages of all of the second memory cells MC2 have reached a second target voltage level.

If the first memory cells MC1 and/or the second memory cells MC2 are not fully programmed, a second program loop PLP2 may be performed. The second program loop PLP2 is similar to the first program loop PLP1, except that in the second program loop PLP2, a third program voltage VPGM12 higher than the first program voltage VPGM11 and a fourth program voltage VPGM22 higher than the second program voltage VPGM21 are applied to the selected wordline WLs. As such, ISPP may be performed by increasing the program voltage until the programming of both the first memory cells MC1 and the second memory cells MC2 is complete.

As illustrated in FIG. 8, the first program verification voltage VPVF1 may have a positive voltage level, so that all of the first memory cells MC1 may have positive threshold voltages after programming is completed. As such, degradation of the data retention capability due to the EPI effect may be reduced by programming all of the first memory cells MC1 from the erased state ES to the first programmed state PS1 to have positive threshold voltages.

FIG. 10A is a diagram illustrating a method of operating a non-volatile memory device according to still another example embodiment, and FIG. 10B is a diagram illustrating voltages corresponding to the method of FIG. 10A. In FIG. 10A, the horizontal axis represents the threshold voltage of the memory cells and the vertical axis represents the number Nc of the memory cells having the corresponding threshold voltage. In FIG. 10B, the horizontal axis represents an elapsed time and the vertical axis represents the voltage level.

All of the selection memory cells may be programmed from the erased state ES to one of the first programmed state PS1 and the second programmed state PS2, respectively. The threshold voltage distribution of the first programmed state PS1 is higher than the threshold voltage distribution of the erased state ES or the threshold voltage distribution of the second programmed state PS2 is higher than the threshold voltage distribution of the first programmed state PS1. The first memory cells MC1 may be programmed to the first programmed state PS1 corresponding to the lowest threshold voltage distribution among the programmed states PS1 and PS2. The second memory cells MC2 may by programmed to the second programmed state PS2 corresponding to the threshold voltage distribution higher than the lowest threshold voltage of the first programmed state PS1.

The programming of the first memory cells MC1 may be performed without verifying whether the first memory cells MC1 are in the first programmed state PS1, which may be referred to as "self-alignment." In contrast, the second memory cells MC2 may be programmed with verification of whether the second memory cells MC2 are in the second programmed state PS2 using a program verification voltage VPVF.

Referring to FIGS. 10A and 10B, the first memory cells MC1 and the second memory cells MC2 may be programmed to the first programmed state PS1 and then the second memory cells MC2 may be programmed to the second programmed state PS2.

In a first program loop PLP1, a first program voltage VPGM1 is applied to a selected wordline WLs, and a program permission voltage VPER is applied to both of the bitlines BL(MC1) of the first memory cells MC1 and the bitlines BL(MC2) of the second memory cells MC2. Accordingly, all of the first memory cells MC1 and the second memory cells MC2 are programmed regardless of the program data. A second program loop PLP2 is similar to the first program loop PLP1, but a second program voltage VPGM2 higher than the first program voltage VPGM1 is applied to the selected wordline WLs in the second program loop PLP2.

Even though FIG. 10B illustrates that the two program loops PLP1 and PLP2 are used to all of the first memory cells MC1 and the second memory cells MC2, one program loop may be used or three or more program loops may be used to program all of the first and second memory cells MC1 and MC2. As such, all of the first memory cells MC1 and the second memory cells MC2 may be programmed to the first programmed state PS1 by applying the program permission voltage VPER to all of the bitlines regardless of the program data during at least one initial program loop.

After completing the programming of the first programmed state PS1, programming of the second memory cells MC2 is performed. In a third program loop PLP3, a third program voltage VPGM3 is applied to the selected wordline WLs, the program permission voltage VPER is applied to the bitlines BL(MC2) of the second memory cells MC1 and the program inhibition voltage VINH is applied to the bitlines BL(MC1) of the first memory cells MC1. Accordingly, among the selection memory cells, the second memory cells MC2 may be programmed.

After applying the third program voltage VPGM3, a program verification voltage VPVF is applied to the selected wordline WLs to verify whether the threshold voltages of all of the second memory cells MC2 have reached the target voltage level. If the second memory cells MC2 are not fully programmed, a fourth program loop PLP4 may be performed.

The fourth program loop PLP4 is similar to the third program loop PLP3, except that a fourth program voltage VPGM4 higher than the third program voltage VPGM3 is applied to the selected wordline WLs in the fourth program loop PLP4. As such, ISPP may be performed by increasing the program voltage until the program of the second memory cells MC2 is completed.

As illustrated in FIG. 10A, at least a portion of the first memory cells MC1 may have positive threshold voltages after programming is completed. As described above, the first memory cells MC1 may be programmed to the first programmed state PS1 by the self-alignment scheme without verification. As such, degradation of the data retention capability due to the EPI effect may be reduced by programming the first memory cells MC1 from the erased state ES to the first programmed state PS1 so that at least a portion of the first memory cells MC1 may have positive threshold voltages.

Figure 11A:
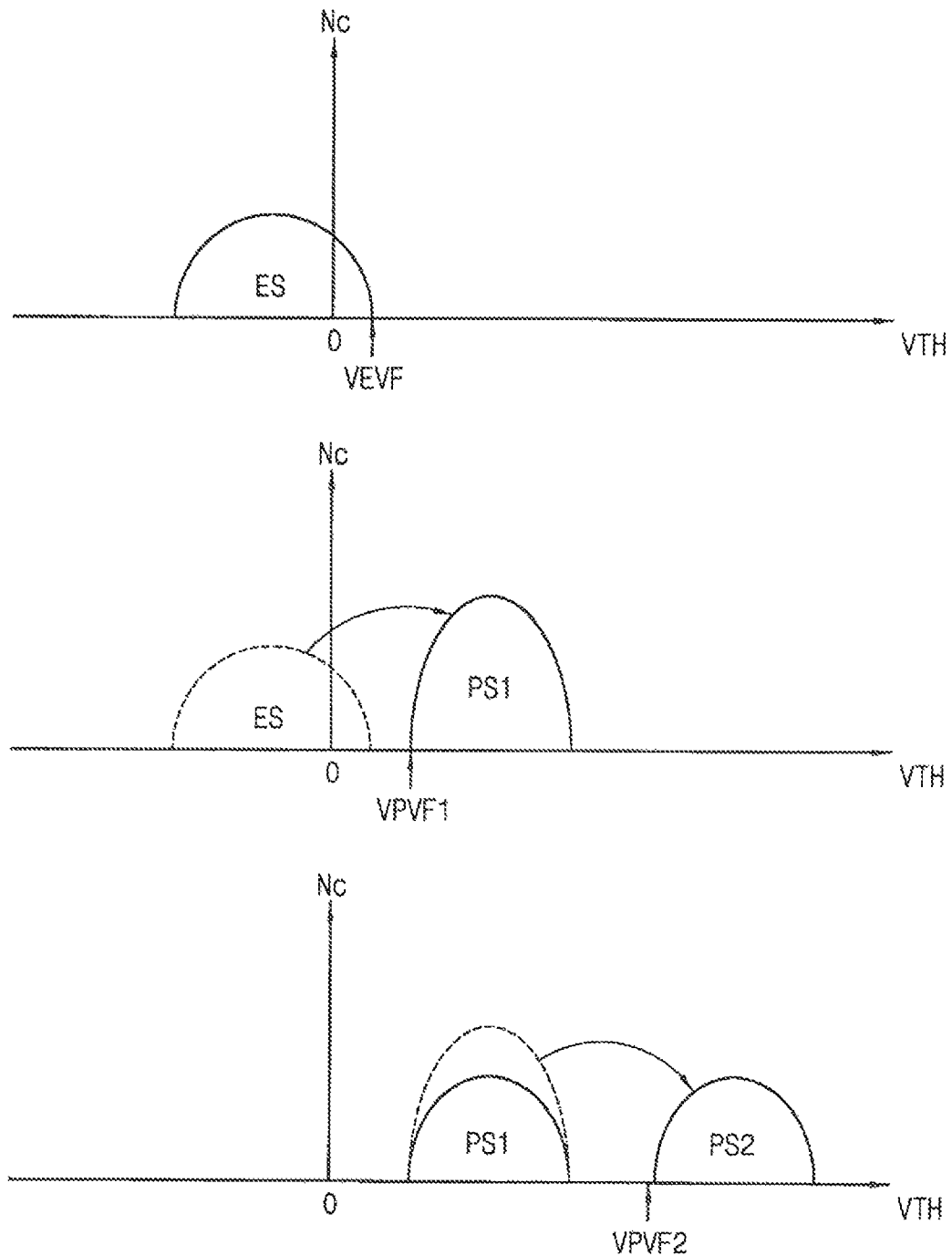
FIG. 11A is a diagram illustrating a method of operating a non-volatile memory device according to an example embodiment.
Figure 11B:
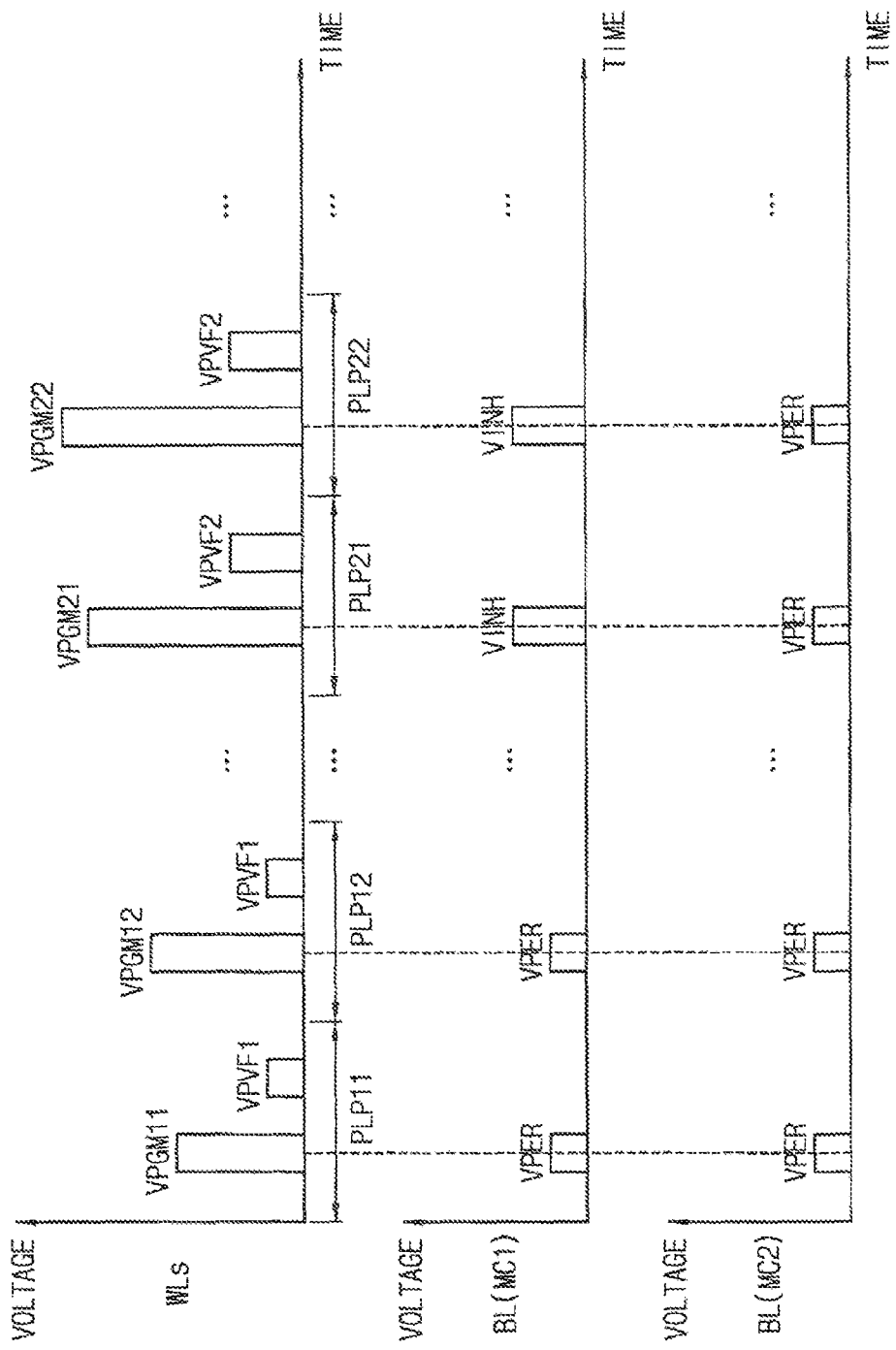
FIG. 11B is a diagram illustrating voltages corresponding to the method of FIG. 11B.

FIG. 11A is a diagram illustrating a method of operating a non-volatile memory device according to further embodiments, and FIG. 11B is a diagram illustrating voltages corresponding to the method of FIG. 11A. In FIG. 11A, the horizontal axis represents the threshold voltage of the memory cells and the vertical axis represents the number Nc of the memory cells having the corresponding threshold voltage. In FIG. 11B, the horizontal axis represents an elapsed time and the vertical axis represents voltage level.

Referring to FIG. 11A, all of the selection memory cells may be programmed initially from the erased state ES to a first programmed state PS1. Then, second memory cells MC2 among the selection cells are programmed to a second programmed state PS2, while first memory cells MC1 among the selection cells are kept at the first programmed state PS1. The threshold voltage distribution of the first programmed state PS1 is higher than the threshold voltage distribution of the erased state ES, and the threshold voltage distribution of the second programmed state PS2 is higher than the threshold voltage distribution of the first programmed state PS1. Accordingly, the first memory cells MC1 may be programmed to the first programmed state PS1, while the second memory cells MC2 may be programmed to the second programmed state PS2.

After the memory cells MC1 and MC2 have been programmed to the first programmed state PS1, a verification step may be performed in which it is determined whether the first memory cells MC1 are in the first programmed state PS1 by applying a first program verification voltage VPVF1 to the first memory cells MC1. In the same way, after the second memory cells MC2 have been programmed to the second programmed state PS2, the programming of the second memory cells MC2 may be verified by using a second program verification voltage VPVF2 that is higher than the first program verification voltage VPVF1.

Referring to FIG. 11B, in a first program loop PLP11, a first program voltage VPGM11 is applied to wordlines WLs corresponding to the selection cells, a program permission voltage VPER is applied to the bitlines BL(MC1) of the first memory cells MC1 and the bitlines BL(MC2) of the second memory cells MC2. Accordingly, in the first program loop PLP11, the first memory cells MC1 and the second memory cells MC2 may be programmed to the first programmed state PS1.

After applying the first program voltage VPGM11, a first program verification voltage VPVF1 is applied to the selected wordline WLs to verify whether the threshold voltages of all of the first memory cells MC1 have reached a target voltage level. If the first memory cells MC1 are not fully programmed, a second program loop PLP12 may be performed.

After the programming of the first memory cells MC1 is complete, the second memory cells MC2 may be programmed. In a third program loop PLP21, a third program voltage VPGM21 is applied to the selected wordline WLs, the program permission voltage VPER is applied to the bitlines BL(MC2) of the second memory cells MC1 and the program inhibition voltage VINH is applied to the bitlines BL(MC1) of the first memory cells MC1. Accordingly, the second memory cells MC2 may be programmed, while the first memory cells MC1 remain at the first programmed state PS1.

After applying the third program voltage VPGM21, a second program verification voltage VPVF2 that is higher than the first program verification voltage VPVF1 is applied to the selected wordline WLs to verify whether the threshold voltages of all of the second memory cells MC2 have reached a target voltage level. If the second memory cells MC2 are not fully programmed, a fourth program loop PLP22 may be performed.

The fourth program loop PLP22 is similar to the third program loop PLP21, but a fourth program voltage VPGM22 higher than the third program voltage VPGM21 is applied to the selected wordline WLs in the fourth program loop PLP22. As with the first memory cells MC1, ISPP may be performed by incrementally increasing the program voltage after each programming loop until the programming of the second memory cells MC2 is completed.

As illustrated in FIG. 11A, the first program verification voltage VPVF1 may have a positive voltage level, so that all of the first memory cells MC1 have positive threshold voltages after programming is completed. As such, degradation of the data retention capability due to the EPI effect may be reduced by programming all of the first memory cells MC1 from the erased state ES to the first programmed state PS1 to have positive threshold voltages.

FIG. 12 is a diagram that illustrates a first operation mode and a second operation mode in a method of operating a non-volatile memory device according to some example embodiments.

The first operation mode may correspond to the SLC storing one data bit and the second operation mode may be correspond to the MLC storing multiple data bits. Even though FIG. 12 illustrates for convenience of description that each memory cell stores two data bits in the second operation mode, each memory cell may store three or more data bits in the second operation mode.

Referring to FIG. 12, according to the first operation mode, all of the SLCs may be programmed respectively to one of the programmed states PS1 and PS2. Thus, all of the SLCs may have positive threshold voltages. In the same way, all of the MLCs may be programmed respectively to one of the programmed states PS11, PS12, PS13 and PS14; thus, all of the MLCs may have positive threshold voltages.

In some example embodiments, the programmed states PS1 and PS2 of the SLCs according to the first operation mode may be programmed by ISPP using the two program verification voltages VPVF1 and VPVF2, and the programmed states PS11, PS12, PS13 and PS14 of the MLCs according to the second operation mode may be programmed by ISPP using the four program verification voltages VPVF11, VPVF12, VPVF13 and VPVF14. In other example embodiments, the programmed states PS1 and PS11 of the first and second operation modes corresponding to the lowest threshold voltage distribution may be programmed by the self-alignment scheme without verification.

Figure 13:
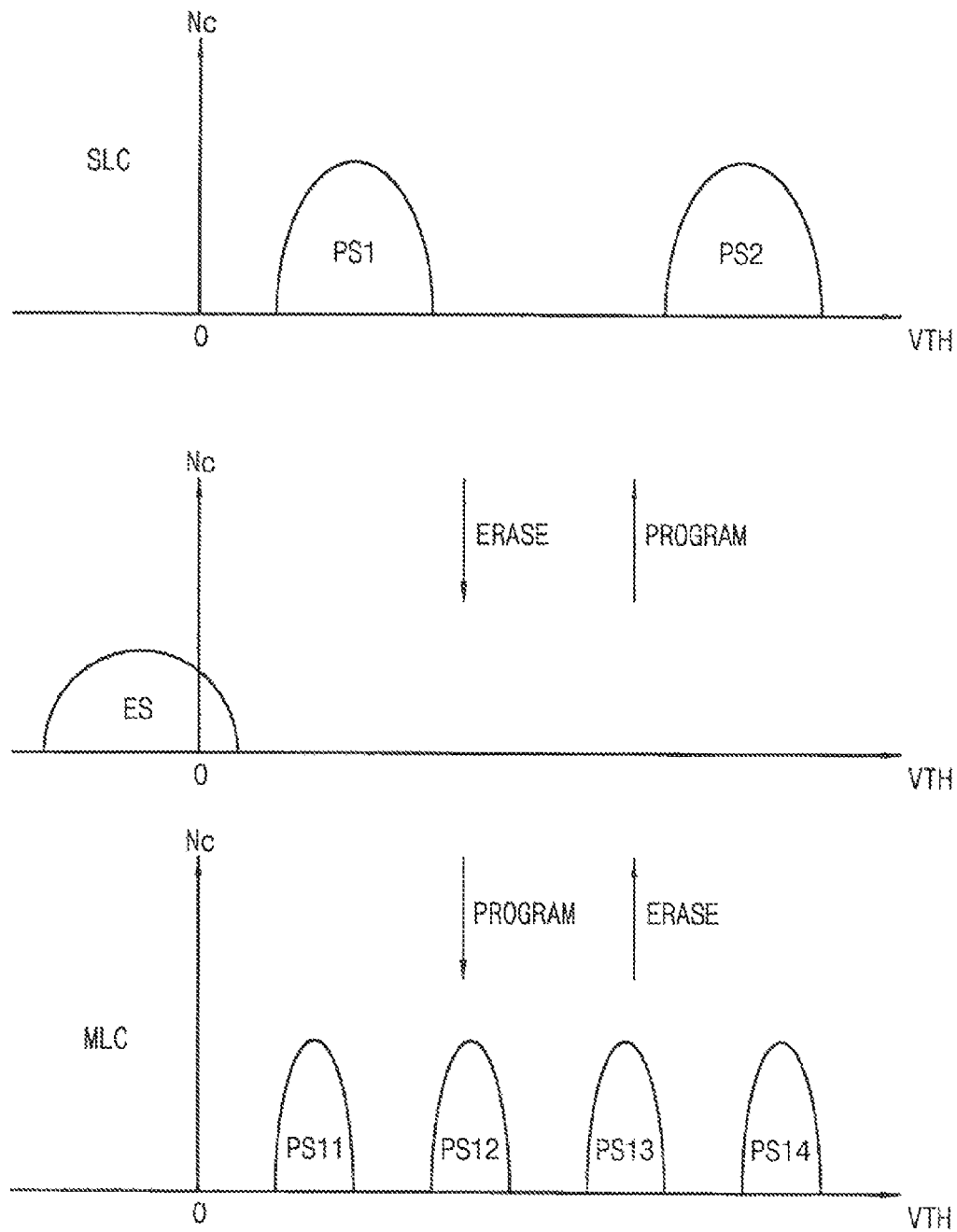
FIG. 13 is a diagram illustrating a transition between the first operation mode and the second operation mode of FIG. 12.

FIG. 13 is a diagram illustrating a transition between the first operation mode and the second operation mode of FIG. 12.

Referring to FIG. 13, the SLCs storing one data bit may be programmed as and converted to MLCs that store two or more data bits. In addition, the MLCs may be programmed as and converted to SLCs. Before programming new data in the memory cells, an erase operation may be performed to erase the programmed states of the memory cells.

When SLCs are converted and programmed for use as MLCs, the programmed states PS1 and PS2 of the SLCs have to be erased to the erased state ES. As described above, the erased state ES may be a shallow-erased state in which at least a portion of the selection memory cells in the erased state ES may have positive threshold voltages. Thus, the erase verification voltage VEVF may be greater than zero. The programmed states PS11, PS12, PS13 and PS14 of the MLCs may be programmed from such shallow-erased state ES.

When the MLCs are converted and programmed as the SLCs, the programmed state PS11, PS12, PS13 and PS14 of the MLCs have to be erased to the erased state ES. Also the erased state ES may be the same as the case that the SLCs are converted to the MLCs. The programmed states PS1 and PS2 of the SLCs may be programmed from such shallow-erased state ES.

Figure 14:
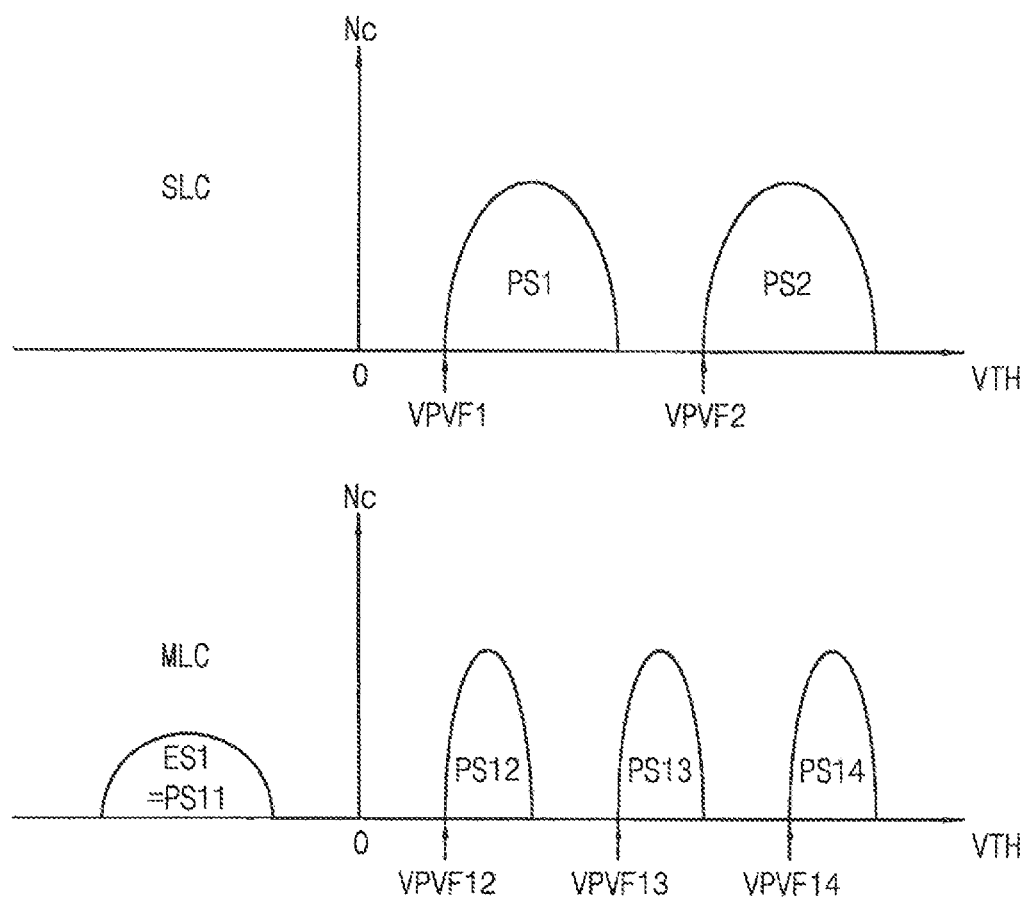
FIG. 14 is a diagram for describing a first operation mode and a second operation mode by a method of operating a non-volatile memory device according to another example embodiment.

FIG. 14 is a diagram for describing a first operation mode and a second operation mode by a method of operating a non-volatile memory device according to another example embodiment.

The first operation mode may correspond to an SLC storing one data bit and the second operation mode may be correspond to an MLC storing multiple data bits. Even though FIG. 14 illustrates for convenience of description that each memory cell stores two data bits in the second operation mode, each memory cell may store three or more data bits in the second operation mode.

Referring to FIG. 14, all of the SLCs according to the first operation mode may be programmed respectively to one of the programmed states PS1 and PS2, and thus all of the SLCs may have positive threshold voltages. In contrast, some of the MLCs may remain in the erased state ES1, while the other ones of the MLCs may be programmed respectively to one of the programmed states PS12, PS13 or PS14. In case of the MLCs, the read margins are decreased because the number of states needed to represent different data values are increased, as described with reference to FIG. 5. Thus, MLCs may be excessively-erased and the erased state ES1 may represent one data value to secure the increased read margins.

In some example embodiments, the programmed states PS1 and PS2 of the SLCs according to the first operation mode may be programmed by ISPP using the two program verification voltages VPVF1 and VPVF2, and the programmed states PS12, PS13 and PS14 of the MLCs according to the second operation mode may be programmed by ISPP using the three program verification voltages VPVF12, VPVF13 and VPVF14. In other example embodiments, the programmed state PS1 of the first operation mode corresponding to the lowest threshold voltage distribution may be programmed by the self-alignment scheme without verification.

Figure 15:
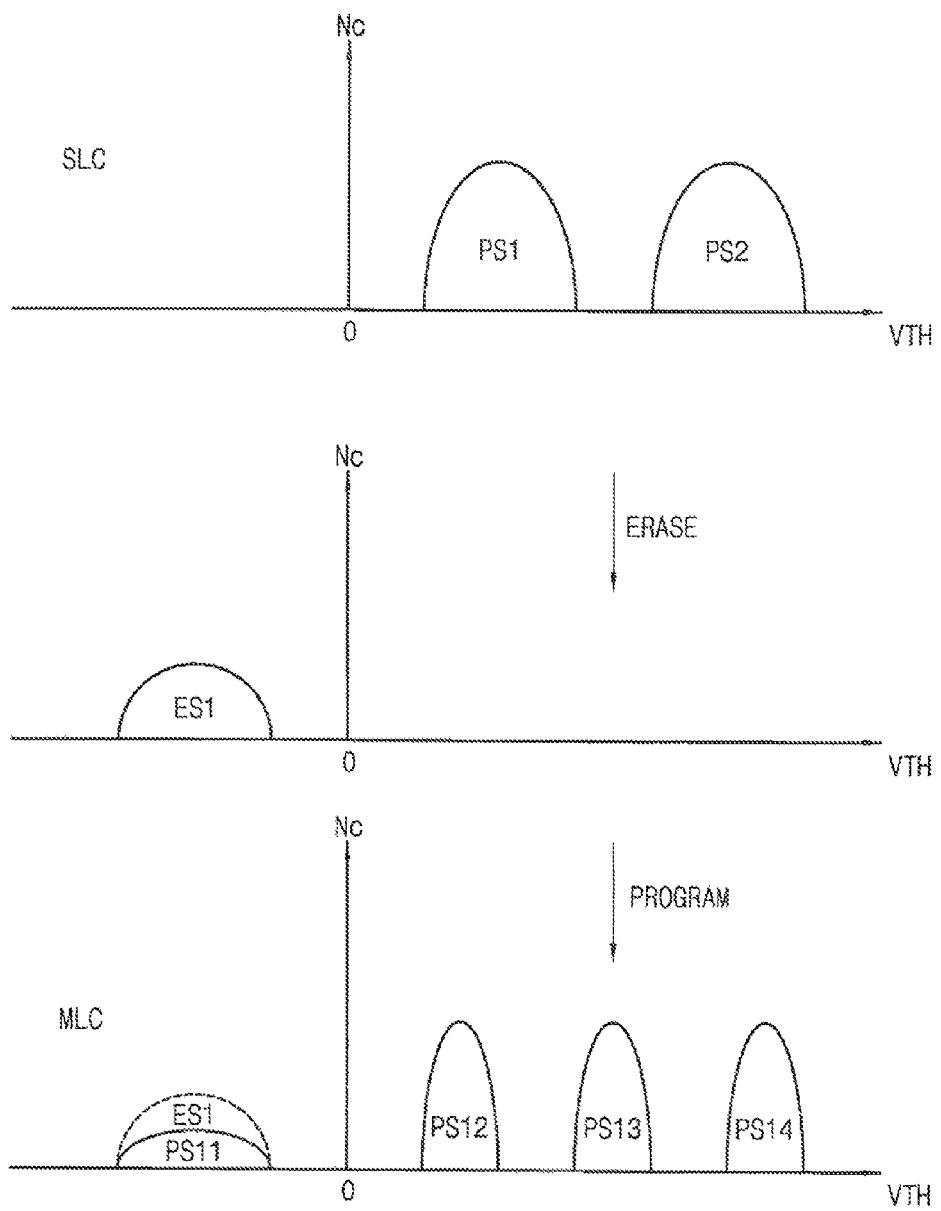
FIG. 15 is a diagram illustrating a transition from the first operation mode to the second operation mode of FIG. 14.

FIG. 15 is a diagram illustrating a transition from the first operation mode to the second operation mode of FIG. 14.

Referring to FIG. 15, SLCs that store one data bit may be programmed as and converted to MLCs that store two or more data bits. Before programming new data in the memory cells, an erase operation may be performed to erase the programmed states of the memory cells.

When the SLCs are converted and programmed as MLCs, the programmed state PS1 and PS2 of the SLCs have to be erased to the erased state ES. As described above, the erased state ES1 may be an excessively-erased state in which all of the selection memory cells in the erased state ES1 may have negative threshold voltages. The programmed states PS11, PS12, PS13 and PS14 of the MLCs may be programmed from such excessively-erased state ES1.

Figure 16:
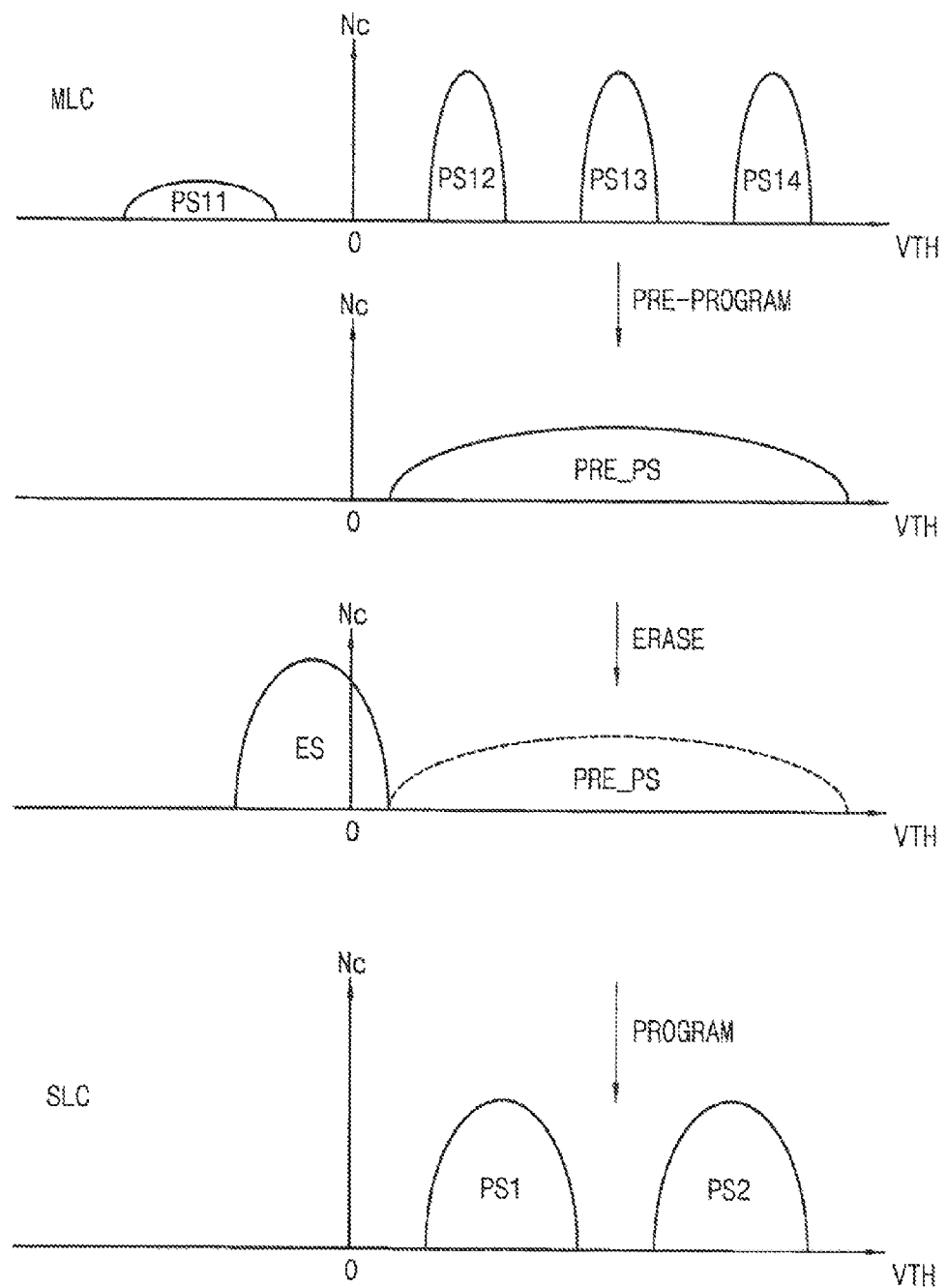
FIG. 16 is a diagram illustrating a transition from the second operation mode to the first operation mode of FIG. 14.

FIG. 16 is a diagram illustrating a transition from the second operation mode to the first operation mode of FIG. 14.

Referring to FIG. 16, MLCs that store multiple data bits may be programmed as and converted to SLCs that store a single data bit. Before programming new data in the memory cells, the erase operation is required to erase the programmed states of the memory cells.

When the MLCs are converted and programmed as SLCs, the memory cells programmed as the MLCs are pre-programmed to a pre-programmed state PRE_PS such that a threshold voltage distribution of the pre-programmed state PRE_PS is higher than the threshold voltage distribution of the erased state ES of the SLCs. Moreover, the excessively-erased memory cells corresponding to the lowest voltage distribution PS11 in the MLC are programmed to have a threshold voltage in the pre-programmed state PRE_PS that is greater than zero. After that, the memory cells in the pre-programmed state PRE_PS are erased to the erased state ES of the SLCs. As described above, the erased state ES may be a shallow-erased state in which at least a portion of the selection memory cells in the erased state ES may have positive threshold voltages. The programmed states PS1 and PS2 of the SLCs may be programmed from such shallow-erased state ES.

Figure 17:
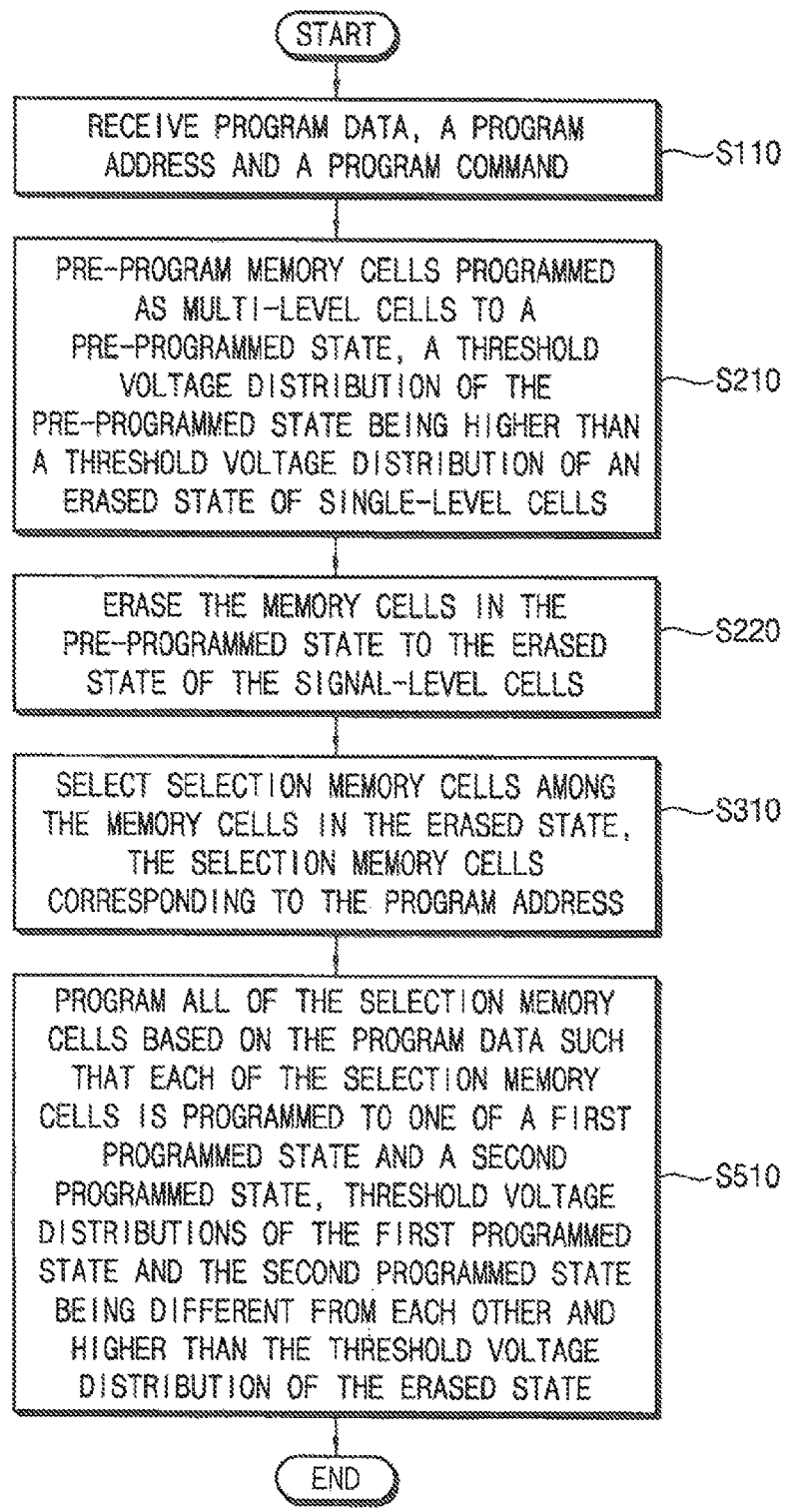
FIG. 17 is a flow chart illustrating a method of operating a non-volatile memory device according to example embodiments.

FIG. 17 is a flow chart illustrating a method of operating a non-volatile memory device according to example embodiments.

Referring to FIG. 17, program data, a program address and a program command are received by the non-volatile memory device (S110). As described with reference to FIG. 16, memory cells programmed as MLCs are pre-programmed to a pre-programmed state PRE_PS (S210) such that a threshold voltage distribution of the pre-programmed state PRE_PS is higher than a threshold voltage distribution of an erased state ES of SLCs, and the memory cells in the pre-programmed state PRE_PS are erased to the erased state ES of the SLCs (S220). Selection memory cells are selected among the memory cells in the erased state ES where the selection memory cells correspond to the program address (S310). The program address accompanied by the program command may include a column address for selecting a bitline and a row address for selecting a wordline. The program operation may be performed with respect to the memory cells connected to the wordline selected based on the row address.

All of the selection memory cells are programmed based on the program data such that each of the selection memory cells is programmed to one of a first programmed state PS1 and a second programmed state PS2, where voltage distributions of the first programmed state PS1 and the second programmed state PS2 are different from each other and higher than the threshold voltage distribution of the erased state ES (510).

In case of single-level cells, as described above with reference to FIGS. 6 through 11, the selection memory cells in the erased state ES to be programmed may be divided into first memory cells MC1 corresponding to a first value (e.g., a bit value of '1') of the program data and second memory cells MC2 corresponding to a second value (e.g., a bit value of '0') of the program data. The first memory cells MC1 may be programmed to a first programmed state PS1 corresponding to a lowest threshold voltage distribution among the programmed states. The second memory cells MC2 may be programmed to a second programmed state PS2 corresponding to a threshold voltage distribution higher than the lowest threshold voltage distribution of the first programmed state PS1.

In some example embodiments, as described above with reference to FIGS. 6 through 9, 11A and 11B, all of the selection memory cells may have positive threshold voltages after programming is completed. In other example embodiments, as described above with reference to FIGS. 10A and 10B, at least a portion of the selection memory cells may have positive threshold voltages after programming is completed.

As such, the non-volatile memory device and the method of operating the non-volatile memory device may reduce degradation of the data retention capability due to the EPI effect by programming all or a portion of the memory cells corresponding to the erased state to have the positive threshold voltages.

Figure 18:
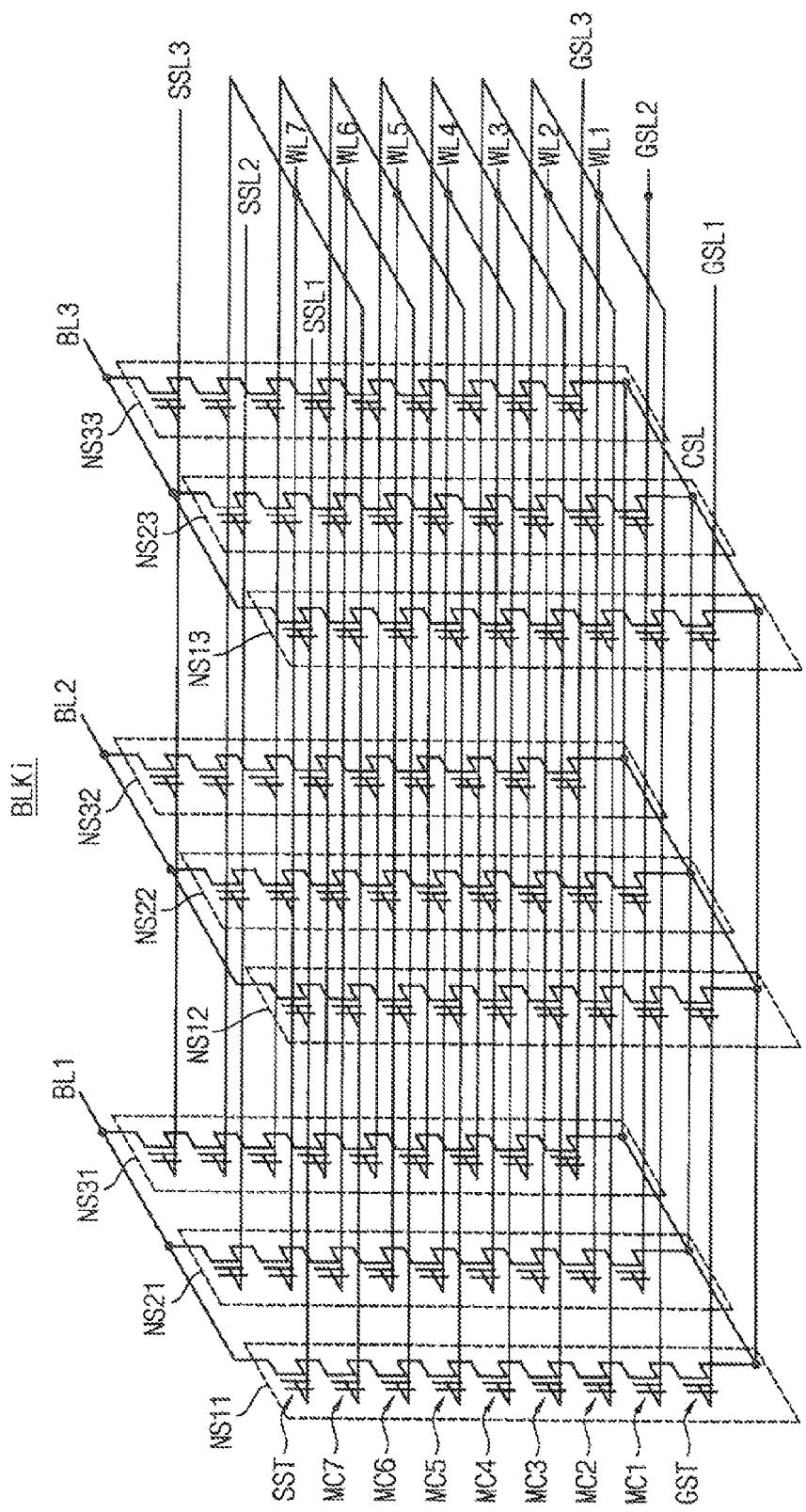
FIG. 18 is a circuit diagram illustrating an example of a three-dimensional flash cell array.

FIG. 18 is a circuit diagram illustrating an example of a three-dimensional flash cell array. FIG. 18 illustrates one memory block BLKi of a three-dimensional NAND flash memory device a including a plurality of vertical NAND strings NS.

Referring to FIG. 18, vertical strings NS11, NS21, and NS31 may be provided between a first bit line BL1 and a common source line CSL, vertical strings NS12, NS22, and NS32 may be provided between a second bit line BL2 and the common source line CSL, and vertical strings NS13, NS23, and NS33 may be provided between a third bit line BL3 and the common source line CSL. The first through third bit lines BL1 through BL3 may correspond to conductive materials, respectively, extending in the direction perpendicular to the vertical strings and the common source lines.

A string selection transistor SST of each vertical string NS may be connected to a corresponding bit line BL. A ground selection transistor GST of each vertical string NS may be connected to the common source line CSL. In each vertical string NS, memory cells MC may be provided between the string selection transistor SST and the ground selection transistor GST.

The vertical strings NS may be defined by the row and by the column. The vertical strings NS connected to one bit line in common may form one column. For example, the vertical strings NS11 through NS31 connected to the first bit line BL1 may correspond to a first column. The vertical strings NS12 through NS32 connected to the second bit line BL2 may correspond to a second column. The vertical strings NS13 through NS33 connected to the third bit line BL3 may correspond to a third column.

The vertical strings NS connected to one string selection line SSL may form one row. For example, the vertical strings NS11 through NS13 connected to a first string selection line SSL1 may form a first row. The vertical strings NS21 through NS23 connected to a second string selection line SSL2 may form a second row. The vertical strings NS31 through NS33 connected to a third string selection line SSL3 may form a third row.

In each vertical string NS, a height may be defined. In at least some example embodiments of the inventive concepts, in each vertical string NS, a memory cell MC1 adjacent to the ground selection transistor GST may be defined to have a height of 1. In each vertical string NS, a height of a memory cell may increase in inverse proportion to a distance from a string selection transistor SST. In each vertical string NS, a memory cell MC7 adjacent to the string selection transistor SST may be defined to have a height of 7.

The vertical strings in the same row may share the string selection line SSL. The vertical strings in different rows may be connected to different string selection lines SSL1, SSL2, and SSL3, respectively. In each vertical string NS in the same row, memory cells having the same height may share a word line WL. At the same height, word lines WL connected to memory cells of vertical strings in different rows may be connected in common.

In at least some example embodiments of the inventive concepts, the word lines WL may be connected in common at a layer where conductive materials extending along a first direction are provided. In at least some example embodiments of the inventive concepts, the conductive materials extending along the first direction may be connected to an upper layer via contacts. The conductive materials extending along the first direction may be connected in common at the upper layer.

In the same row of vertical strings NS, ground selection transistors GST may share a ground selection line GSL. In different rows of vertical strings NS, ground selection transistors GST may share the ground selection line GSL. That is, the vertical strings NS11 through NS13, NS21 through NS23, and NS31 through NS33 may be connected in common to the ground selection line GSL. The common source line CSL may be connected in common to vertical strings NS.

As illustrated in FIG. 18, word lines WL placed at the same height may be connected in common. Thus, when a word line placed at a specific height is selected, all vertical strings connected with the selected word line may be selected. The vertical strings NS in different rows may be connected to different string selection lines SSL. Thus, vertical strings NS in an unselected row from among vertical strings connected with the same word line may be separated from a corresponding bit line by selecting the string selection lines SSL1 through SSL3. That is, a row of vertical strings may be selected by selecting and unselecting the string selection lines SSL1 through SSL3. A column of vertical strings in a selected row may be selected by selecting bit lines BL1 through BL3.

Figure 19:
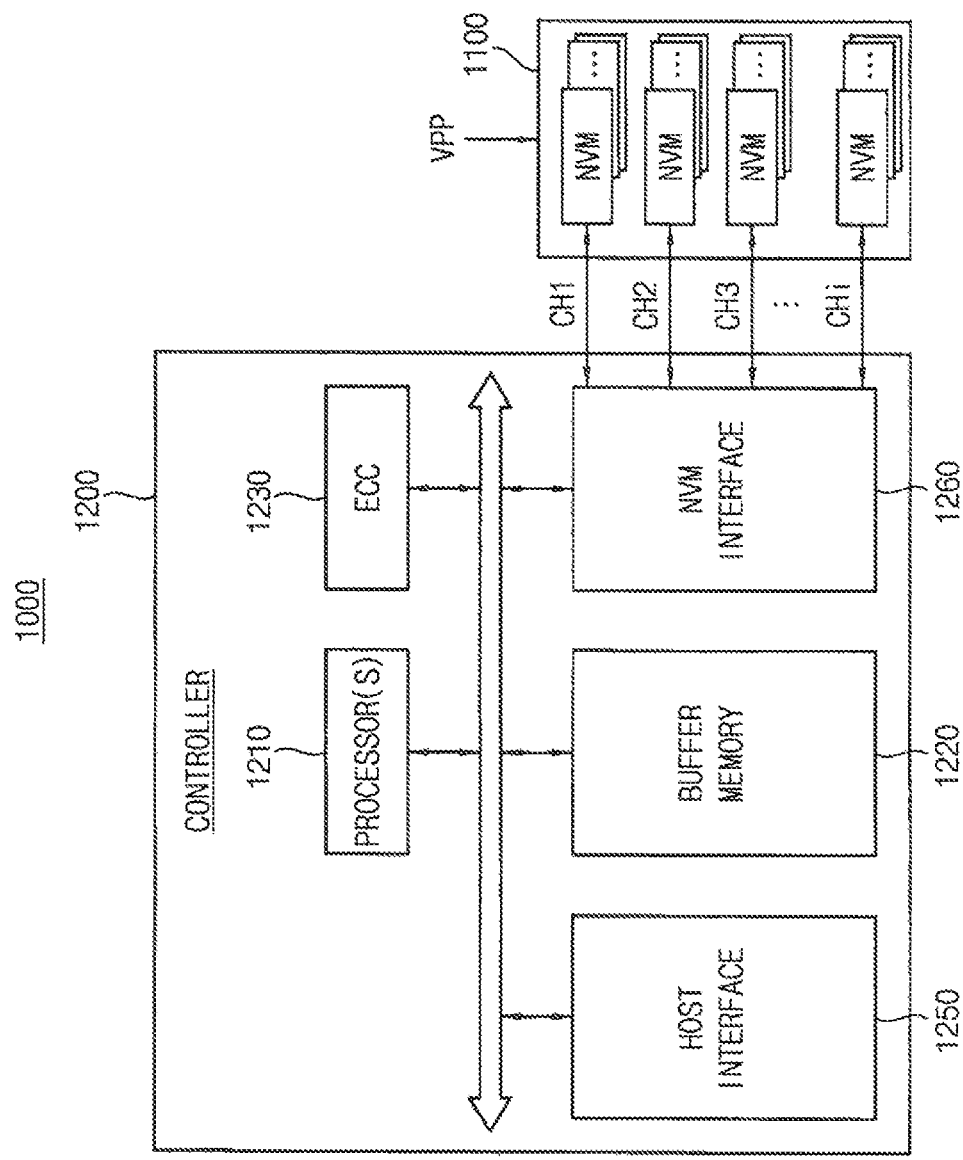
FIG. 19 is a block diagram illustrating a solid state disc or solid state drive (SSD) according to example embodiments.

FIG. 19 is a block diagram illustrating a solid state disc or solid state drive (SSD) according to example embodiments.

Referring to FIG. 19, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may include the above-described vertical NAND flash memory device.

The SSD controller 1200 is connected to the nonvolatile memory devices 1100 through multiple channels CH1 to CHi. The SSD controller 1200 comprises one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 19 illustrates an embodiment where the buffer memory 1220 is included in the SSD controller 1200, the inventive concept is not limited thereto. Alternatively, for instance, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 19, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

The SSD 1000 may program all of the selection memory cells corresponding to the program address such that each of the selection memory cells is programmed to one of programmed states where threshold voltage distributions of the programmed states are different from each other and higher than a threshold voltage distribution of the erased state. Degradation of the data retention capability due to the EPI effect may be reduced by programming all or a portion of the memory cells corresponding to the erased state to have the positive threshold voltages.

Figure 20:
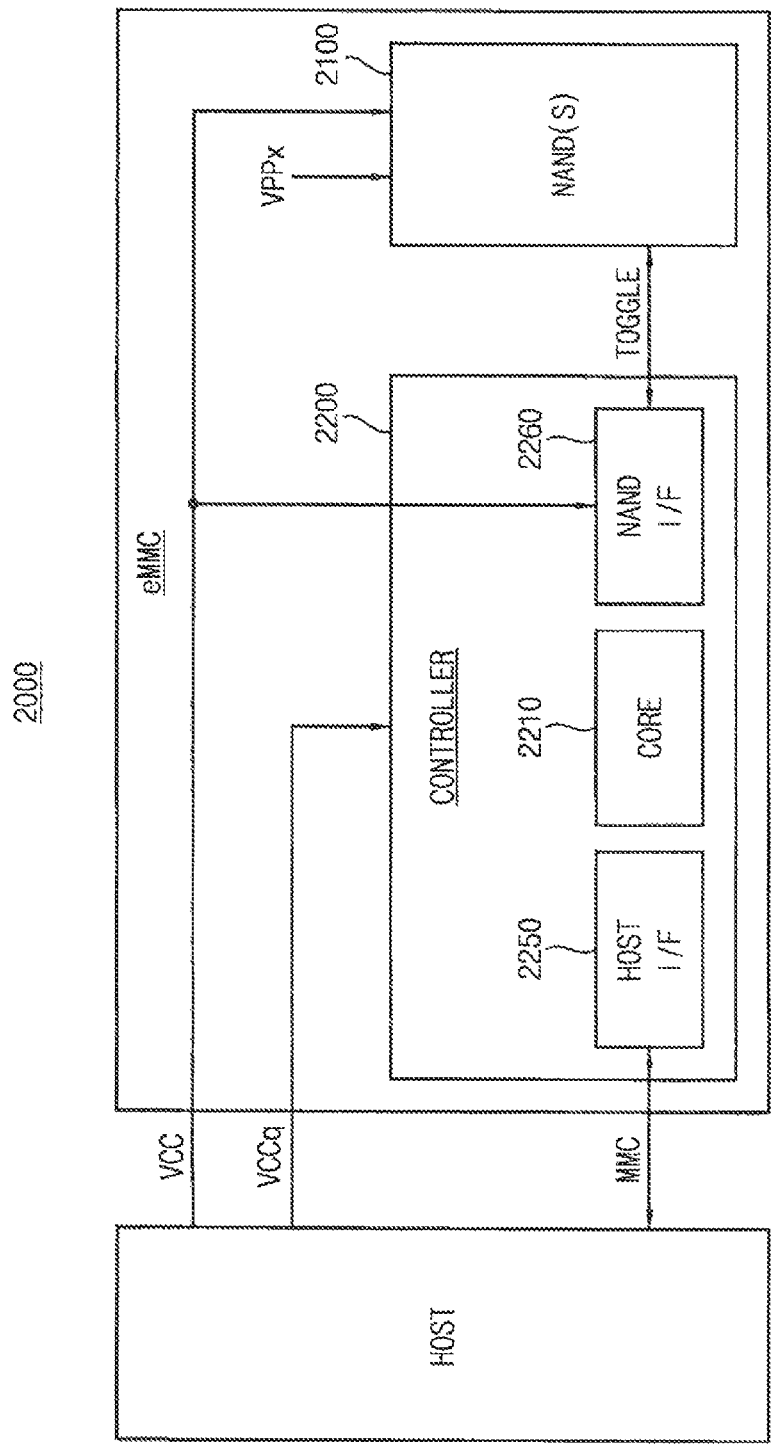
FIG. 20 is a block diagram illustrating an embedded multi-media card (eMMC) according to example embodiments.

FIG. 20 is a block diagram illustrating an embedded multi-media card (eMMC) according to example embodiments.

Referring to FIG. 20, an eMMC 2000 comprises one or more NAND flash memory devices 2100 and a controller 2200.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2210 and a host. The NAND interface 2260 is configured to provide an interface between the NAND flash memory device 2100 and the controller 2200. In some example embodiments, the host interface 2250 may be a parallel interface (e.g., an MMC interface). In other example embodiments, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In some embodiments, eMMC 2000 may be optionally supplied with an external high voltage VPPx.

The eMMC 2000 may program all of the selection memory cells corresponding to the program address in the NAND flash memory device 2100 such that each of the selection memory cells is programmed to one of programmed states where threshold voltage distributions of the programmed states are different from each other and higher than a threshold voltage distribution of the erased state. Degradation of the data retention capability due to the EPI effect may be reduced by programming all or a portion of the memory cells corresponding to the erased state to have the positive threshold voltages.

Figure 21:
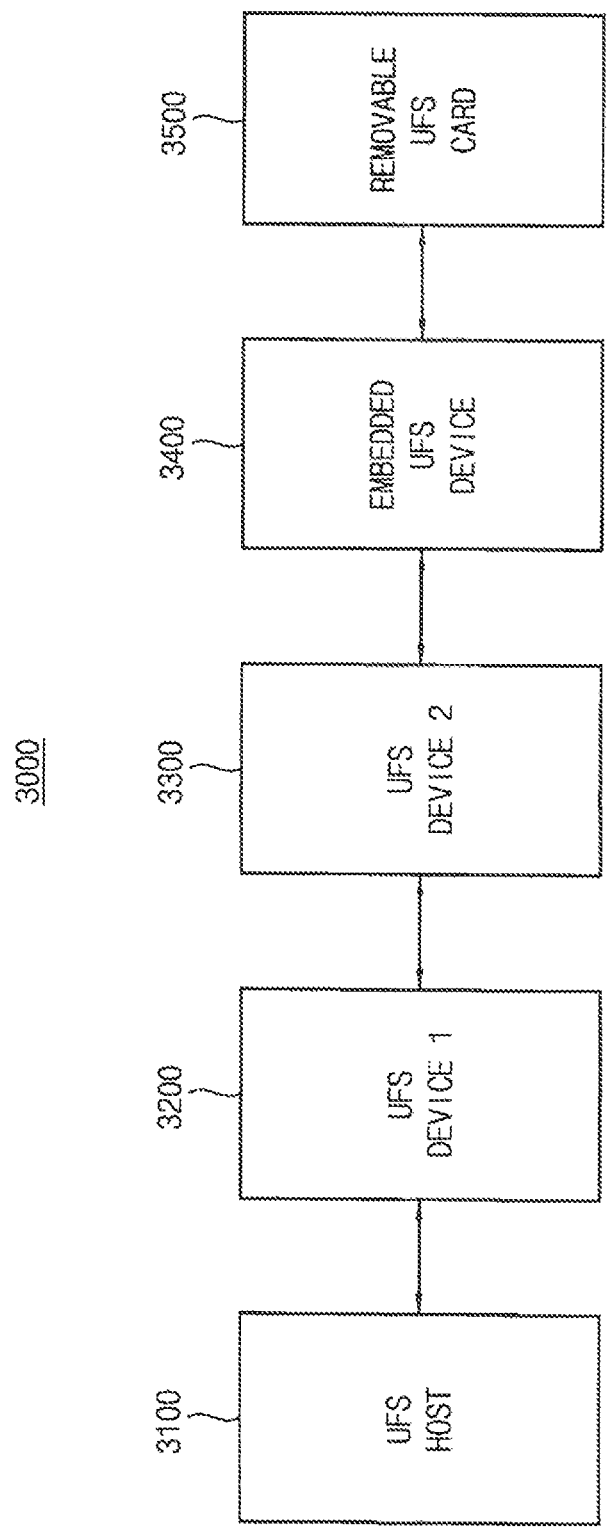
FIG. 21 is a block diagram illustrating a universal flash storage (UFS) according to example embodiments.

FIG. 21 is a block diagram illustrating a universal flash storage (UFS) according to example embodiments.

Referring to FIG. 21, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by a nonvolatile memory device.

The UFS system 3000 may program all of the selection memory cells corresponding to the program address in the UFS devices 3200 and 3300, the embedded UFS device 3400, and the removable UFS card 3500 such that each of the selection memory cells is programmed to one of programmed states where threshold voltage distributions of the programmed states are different from each other and higher than a threshold voltage distribution of the erased state. Degradation of the data retention capability due to the EPI effect may be reduced by programming all or a portion of the memory cells corresponding to the erased state to have the positive threshold voltages.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 22:
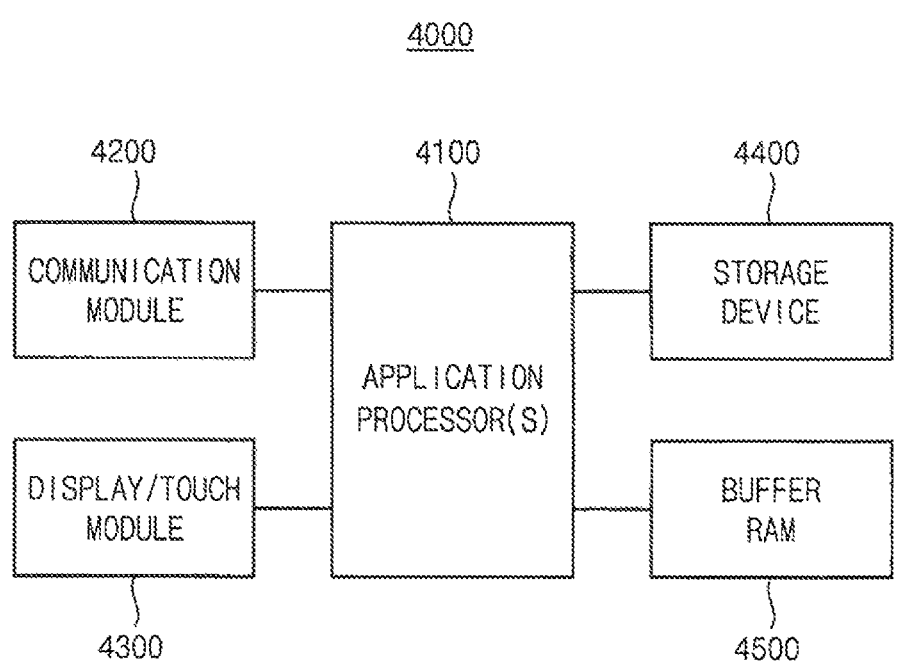
FIG. 22 is a block diagram illustrating a mobile device according to example embodiments.

FIG. 22 is a block diagram illustrating a mobile device according to example embodiments.

Referring to FIG. 22, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc.

The mobile RAM 4500 temporarily stores data used for processing operations of the mobile device 4000.

The mobile device 4000 may program all of the selection memory cells corresponding to the program address in the storage device 4400 such that each of the selection memory cells is programmed to one of programmed states where threshold voltage distributions of the programmed states are different from each other and higher than a threshold voltage distribution of the erased state. Degradation of the data retention capability due to the EPI effect may be reduced by programming all or a portion of the memory cells corresponding to the erased state to have the positive threshold voltages.

A device or a system according to an embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

As described above, the non-volatile memory device and the method of operating the non-volatile memory device may reduce degradation of the data retention capability due to the EPI effect by programming all or a portion of the memory cells corresponding to the erased state to have the positive threshold voltages.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a non-volatile memory device, the method comprising:
   receiving program data and a program address;
   selecting selection memory cells from among memory cells in an erased state, wherein the selection memory cells correspond to the program address;
   programming all of the selection memory cells based on the program data such that each of the selection memory cells is programmed to one of a plurality of programmed states, wherein threshold voltage distributions of the plurality of programmed states are different from each other and wherein threshold voltage distributions of the plurality of programmed states are higher than a threshold voltage distribution of the erased state;
   programming first memory cells among the selection memory cells to a first programmed state using a self-alignment scheme, the first memory cells corresponding to a first value of the program data, the first programmed state corresponding to a lowest threshold voltage distribution among the programmed states; and
   programming second memory cells among the selection memory cells to a second programmed state using incremental step pulse programming (ISPP), the second memory cells corresponding to a second value of the program data, the second programmed state corresponding to a threshold voltage distribution that is higher than the lowest threshold voltage distribution.

2. The method of claim 1, wherein at least a portion of the memory cells in the erased state have positive threshold voltages.

3. The method of claim 2, wherein all of the selection memory cells have positive threshold voltages after programming is completed.

4. The method of claim 1, wherein programming the first memory cells using self-alignment does not include verifying whether the first memory cells are in the first programmed state using a first program verification voltage, and wherein programming the second memory cells comprises verifying whether the second memory cells are in the second programmed state using a second program verification voltage that is higher than the first program verification voltage.

5. The method of claim 4, wherein the first program verification voltage has a positive voltage level such that all of the selection memory cells have positive threshold voltages after programming is completed.

6. The method of claim 1, wherein a program permission voltage is applied to all bitlines corresponding to the selection memory cells regardless of the program data in at least one initial program loop.

7. The method of claim 1, wherein a program command is received along with the program data and the program address, the method further comprising:
   performing an erase operation after receiving the program command to generate an open memory block including memory cells in the erased state.

8. The method of claim 7, wherein performing the erase operation comprises:
   performing incremental step pulse erasing (ISPE) using an erase verification voltage having a positive voltage level such that at least a portion of the memory cells in the erased state have positive threshold voltages.

9. The method of claim 1, further comprising:
   programming single-level cells that store one data bit as multi-level cells that store two or more data bits; and
   programming the multi-level cells as single-level cells.

10. The method of claim 9, wherein programming the multi-level cells as single-level cells comprises:
    pre-programming the memory cells programmed as multi-level cells to a pre-programmed state, a threshold voltage distribution of the pre-programmed state being higher than the threshold voltage distribution of the erased state of the single-level cells; and
    erasing the memory cells in the pre-programmed state to an erased state of the single-level cells.

11. A method of operating a non-volatile memory device, the method comprising:
    receiving program data and a program address;
    selecting a plurality of memory cells that correspond to the program address, wherein the plurality of memory cells are in an erased state, and wherein the plurality of memory cells have a threshold voltage distribution in the erased state such that at least some of the plurality of memory cells have a threshold voltage that is greater than zero;
    programming the plurality of memory cells based on the program data such that each of the plurality of memory cells is programmed to one of a plurality of programmed states having respective threshold voltage distributions, wherein the threshold voltage distributions of the plurality of programmed states are different from each other, and wherein the threshold voltage distributions of the plurality of programmed states are higher than the threshold voltage distribution of the erased state;

programming first memory cells of the plurality of memory cells to a first programmed state using a self-alignment scheme, the first programming state having a first threshold voltage distribution that is higher than the threshold voltage distribution of the erased state; and programming second memory cells of the plurality of memory cells to a second programmed state using incremental step pulse programming (ISPP), the second programming state having a second threshold voltage distribution that is higher than the first threshold voltage distribution.

12. The method of claim 11, wherein programming the first memory cells using the self-alignment scheme does not include verifying whether the first memory cells are in the first programmed state using a first program verification voltage, and wherein programming the second memory cells comprises verifying whether the second memory cells are in the second programmed state using a second program verification voltage that is higher than the first program verification voltage.

13. The method of claim 12, wherein the first program verification voltage has a positive voltage level such that all of the first memory cells and the second memory cells have positive threshold voltages after programming is completed.

14. The method of claim 11, wherein at least some of the first memory cells in the first programmed state have threshold voltages less than zero.

15. The method of claim 11, further comprising:
erasing the plurality of memory cells to the erased state; and
verifying whether the plurality of memory cells are in the erased state using an erase verification voltage that is greater than zero.

* * * * *